(12) United States Patent
Heil et al.

(10) Patent No.: US 8,304,095 B2
(45) Date of Patent: *Nov. 6, 2012

(54) ORGANIC ELECTROLUMINESCENT DEVICES

(75) Inventors: Holger Heil, Darmstadt (DE); Philipp Stoessel, Frankfurt am Main (DE); Rocco Fortte, Frankfurt (DE); Amir Parham, Frankfurt (DE); Horst Vestweber, Gilserberg-Winterscheid (DE)

(73) Assignee: Merck Patent GmbH, Darmstadt (DE)

( * ) Notice: Subject to any disclaimer, the term of this patent is extended or adjusted under 35 U.S.C. 154(b) by 610 days.

This patent is subject to a terminal disclaimer.

(21) Appl. No.: 12/096,507

(22) PCT Filed: Nov. 17, 2006

(86) PCT No.: PCT/EP2006/011028

§ 371 (c)(1),
(2), (4) Date: Jun. 6, 2008

(87) PCT Pub. No.: WO2007/065549

PCT Pub. Date: Jun. 14, 2007

(65) Prior Publication Data

US 2008/0272693 A1      Nov. 6, 2008

(30) Foreign Application Priority Data

Dec. 8, 2005   (DE) .......................... 10 2005 058 543

(51) Int. Cl.
 *H01L 51/54* (2006.01)
(52) U.S. Cl. ........ 428/690; 428/917; 313/504; 313/505; 313/506; 257/40; 257/E51.026; 257/E51.052
(58) Field of Classification Search .................. 428/690, 428/917; 313/504, 505, 506; 564/426, 434; 257/40, E51.026, E51.052
See application file for complete search history.

(56) References Cited

U.S. PATENT DOCUMENTS

| | | | |
|---|---|---|---|
| 4,539,507 A | 9/1985 | VanSlyke et al. | |
| 5,151,629 A | 9/1992 | VanSlyke | |
| 5,840,217 A | 11/1998 | Lupo et al. | |
| 5,998,046 A | 12/1999 | Tada et al. | |
| 6,180,217 B1 * | 1/2001 | Ueda et al. | 428/212 |
| 6,280,859 B1 | 8/2001 | Onikubo et al. | |
| 6,458,909 B1 | 10/2002 | Spreitzer et al. | |
| 2004/0254388 A1 | 12/2004 | Spreitzer et al. | |
| 2006/0063027 A1 | 3/2006 | Vestweber et al. | |
| 2006/0175958 A1 | 8/2006 | Gerhard et al. | |
| 2006/0220004 A1 | 10/2006 | Stossel et al. | |
| 2007/0164273 A1 | 7/2007 | Gerhard et al. | |
| 2007/0170419 A1 | 7/2007 | Gerhard et al. | |

FOREIGN PATENT DOCUMENTS

| | | | |
|---|---|---|---|
| DE | 102005026651 A1 | 12/2006 | |
| EP | 0676461 A2 | 10/1995 | |
| EP | 0866110 A1 | 9/1998 | |
| EP | 1074601 | * | 2/2001 |
| EP | 1074601 A2 | 2/2001 | |
| JP | 04-184892 | 7/1992 | |
| JP | 10-255979 | * | 9/1998 |
| JP | 10-255979 A | 9/1998 | |
| JP | 11-74079 A | 3/1999 | |
| WO | WO-98/27136 A1 | 6/1998 | |
| WO | WO-02/10093 A1 | 2/2002 | |
| WO | WO-2004/058911 A2 | 7/2004 | |
| WO | WO-2004/081017 A1 | 9/2004 | |
| WO | WO-2005/011013 A1 | 2/2005 | |
| WO | WO-2005/084081 A1 | 9/2005 | |
| WO | WO-2005/084082 A1 | 9/2005 | |
| WO | WO-2006/048268 A1 | 5/2006 | |

OTHER PUBLICATIONS

Lupton, et al., "Control of Electrophosphorescence in Conjugated Dendrimer Light-Emitting Diodes", Adv. Funct. Mater., vol. 11, No. 4, pp. 287-294 (2001).

Pålsson, et al., "Synthesis and Excited State Spectroscopy of Tris(distyrylbenzenyl)Amine-Cored Electroluminescent Dendrimers", *Macromolecules*, vol. 35, pp. 7891-7901 (2002).

Cha, et al., "Balancing Charge Carrier Mobility by Constructing Chemical Structures to Contain Both Hole-and-Electron-Transporting Moieties in Electroluminescent Organic Compounds", *Synthetic Metals*, vol. 150, pp. 309-316 (2005).

* cited by examiner

Primary Examiner — Jennifer Chriss
Assistant Examiner — Gregory Clark
(74) Attorney, Agent, or Firm — Connolly Bove Lodge & Hutz LLP

(57) ABSTRACT

The present invention relates to the improvement of blue-emitting organic electroluminescent devices comprising stilbenamines, and to materials for the production of these electroluminescent devices.

17 Claims, No Drawings

ORGANIC ELECTROLUMINESCENT DEVICES

RELATED APPLICATIONS

This application is a national stage application (under 35 U.S.C. §371) of PCT/EP2006/011028, filed Nov. 17, 2006, which claims benefit of German application 10 2005 058 543.4, filed Dec. 8, 2005.

The present invention relates to organic electroluminescent devices comprising stilbenamines, and to materials for the production of these electro-luminescent devices.

The general structure of organic electroluminescent devices which are capable of the emission of light in the visible spectral region and comprise semiconducting organic compounds is described, for example, in U.S. Pat. No. 4,539,507, U.S. Pat. No. 5,151,629, EP 0676461 and WO 98/27136.

However, these devices still exhibit considerable problems which require urgent improvement for use in high-quality full-colour displays. Thus, in particular, the operating lifetime in the case of blue emission is still inadequate, meaning that it has hitherto only been possible to achieve simple applications commercially.

JP 04-184892 describes distilbenamines, tristilbenamines and further stilbene derivatives as emitting compounds for OLEDs. These compounds are employed as pure substance in the emitting layer. The devices comprising the proposed compounds still do not have a satisfactory lifetime, even in the case of optimised device structures with optimised host materials.

The object of the present invention was therefore to offer improvements for this purpose, in particular compounds having an improved lifetime at the same time as comparably good or improved dark-blue colour coordinates and with comparably good efficiency.

Surprisingly, it has been found that organic electroluminescent devices which comprise tristilbenamine derivatives having certain substituents—listed below—in the emitting layer have significant improvements over the prior art. By means of these materials, improved lifetimes can be obtained with a continued dark-blue emission colour and good efficiency. This result is particularly surprising since similarly substituted emitters from the above-mentioned prior art have a significantly worse lifetime. The present invention therefore relates to these compounds and to the use thereof in the emitting layer of OLEDs.

The invention relates to organic electroluminescent devices comprising anode, cathode and at least one organic layer which is capable of the emission of light, characterised in that the organic layer comprises at least one compound of the formula (1)

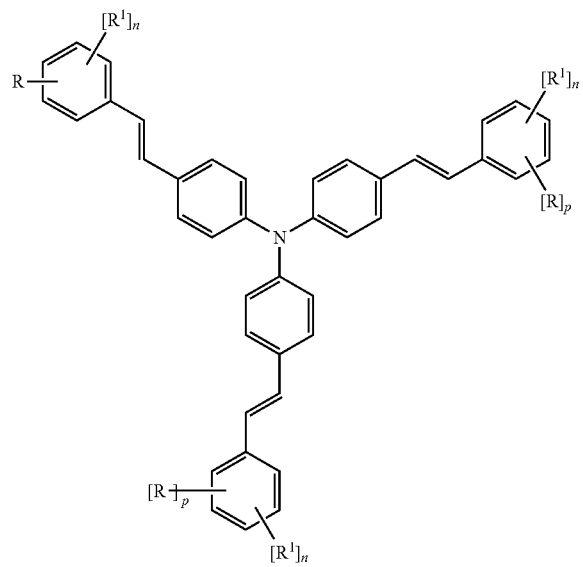

Formula (1)

where the following applies to the symbols and indices used:

R is, identically or differently on each occurrence, F, $OCF_3$, $Si(R^2)_3$, $B(OR^2)_2$ or a straight-chain, branched or cyclic alkyl, alkoxy or thio-alkoxy group having 4 to 10 C atoms, which may be substituted by one or more radicals $R^1$, where one or more non-adjacent $CH_2$ groups may be replaced by $-R^2C=CR^2-$, $-C\equiv C-$, $Si(R^2)_2$, $Ge(R^2)_2$, $Sn(R^2)_2$, C=O, C=S, C=Se, $C=NR^2$, $-O-$, $-S-$, $-N(R^2)-$ or $-CONR^2-$ and where one or more H atoms may be replaced by F, Cl, Br, I, CN or $NO_2$; if R stands for an alkyl, alkoxy or thioalkoxy group, R may also have two bonds to the phenyl group and thus build up a cyclic, condensed ring system;

$R^1$ is, identically or differently on each occurrence, F, Cl, Br, I, CN, $Si(R^2)_3$, $N(R^2)_2$, $B(OR^2)_2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $-R^2C=CR^2-$, $-C\equiv C-Si(R^2)_2$, $Ge(R^2)_2$, $Sn(R^2)_2$, C=O, C=S, C=Se, $C=NR^2$, $-O-$, $-S-$, $-N(R^2)-$ or $-CONR^2-$ and where one or more H atoms may be replaced by F, Cl, Br, I, CN or $NO_2$, or an aromatic or heteroaromatic ring system having 5 to 30 aromatic ring atoms, which may be substituted by one or more radicals $R^2$, or an aryloxy or heteroaryloxy group having 5 to 24 aromatic ring atoms, which may be substituted by one or more radicals $R^2$, or a combination of two, three, four or five of these systems; two or more substituents $R^1$ here may also form a mono- or polycyclic, aliphatic or aromatic ring system with one another;

$R^2$ is on each occurrence, identically or differently, H or a hydrocarbon radical having 1 to 20 C atoms, which may be aliphatic, aromatic or a combination of aliphatic and aromatic and in which, in addition, individual H atoms may be replaced by fluorine; two or more radicals $R^2$ here may also form a mono- or polycyclic, aliphatic or aromatic ring system with one another;

n is, identically or differently on each occurrence, 0, 1, 2, 3 or 4;

p is, identically or differently on each occurrence, 0 or 1.

For the purposes of this invention, a cyclic alkyl group is taken to mean both monocyclic and also bi- and polycyclic alkyl groups.

For the purposes of this invention, an aryl group or a heteroaryl group is taken to mean an aromatic group or heteroaromatic group respectively having a common aromatic π-electron system. For the purposes of this invention, this may be a simple homo- or heterocycle, for example benzene, pyridine, thiophene, etc. or it may be a condensed aromatic ring system in which at least two aromatic or heteroaromatic rings, for example benzene rings, are "fused" to one another, i.e. are condensed onto one another by anellation, i.e. have at least one common edge and thus also a common aromatic π-electron system. These aryl or heteroaryl groups may be substituted or unsubstituted; any substituents present may likewise form further ring systems. Thus, for example, systems such as naphthalene, anthracene, phenanthrene, pyrene, etc., are regarded as aryl groups and quinoline, acridine, benzothiophene, carbazole, etc., are regarded as heteroaryl groups for the purposes of this invention, while, for example, biphenyl, fluorene, spirobifluorene, etc., do not represent aryl groups since they involve separate aromatic π-electron systems.

For the purposes of this invention, an aromatic ring system contains 6 to 30 C atoms in the ring system. For the purposes of this invention, a heteroaromatic ring system contains 2 to 30 C atoms and at least one hetero atom in the ring system, with the proviso that the sum of C atoms and hetero atoms is at least 5. The hetero atoms are preferably selected from N, O and/or S. For the purposes of this invention, an aromatic or heteroaromatic ring system is intended to be taken to mean a system which does not necessarily contain only aryl or heteroaryl groups, but instead in which a plurality of aryl or heteroaryl groups may also be interrupted by a short non-aromatic unit (less than 10% of the atoms other than H, preferably less than 5% of the atoms other than H), such as, for example, an $sp^3$-hybridised C, N or O atom. Thus, for example, systems such as 9,9'-spirobifluorene, 9,9-diarylfluorene, triarylamine, diaryl ether, etc., are also intended to be taken to mean aromatic ring systems for the purposes of this invention. Part of the aromatic or heteroaromatic ring system may also be a condensed group here.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, adamantyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. A $C_1$- to $C_{40}$-alkoxy group is particularly preferably taken to mean methoxy, ethoxy, n-propoxy, i-propoxy, n-butoxy, i-butoxy, s-butoxy, t-butoxy or 2-methylbutoxy. An aromatic or heteroaromatic ring system having 1 to 30 aromatic ring atoms, which may also in each case be substituted by the above-mentioned radicals $R^1$ or $R^2$ and which may be linked to the aromatic or heteroaromatic ring system via any desired positions, is taken to mean, in particular, groups derived from benzene, naphthalene, anthracene, phenanthrene, pyrene, chrysene, perylene, fluoranthene, tetracene, pentacene, benzopyrene, biphenyl, biphenylene, terphenyl, terphenylene, fluorene, spirobifluorene, truxene, isotruxene, dihydrophenanthrene, dihydropyrene, tetrahydropyrene, cis- or trans-indenofluorene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Preferred embodiments of compounds of the formula (1) are described below.

In a preferred embodiment of the invention, the substituent R is bonded in the para-position to the double bond. Preferred compounds of the formula (1) are thus compounds of the formula (1a)

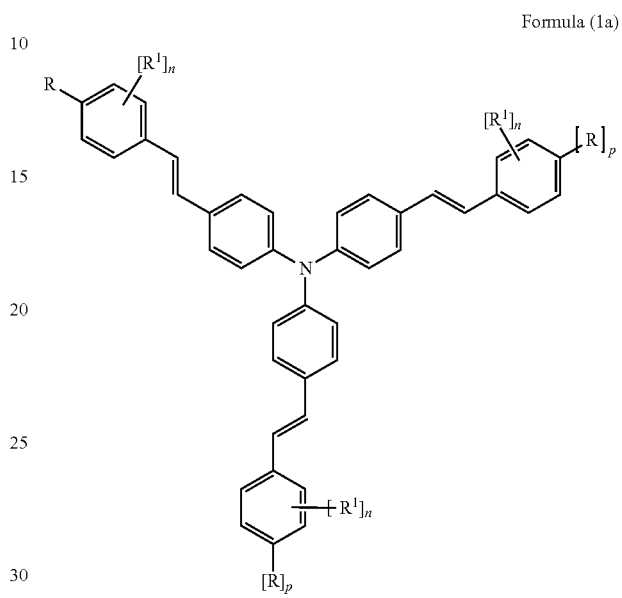

Formula (1a)

where the symbols and indices have the same meaning as described above.

Preference is given to compounds of the formula (1) in which the symbol R, identically or differently on each occurrence, stands for F, $Si(R^2)_3$, $B(OR^2)_2$ or a straight-chain, branched or cyclic alkyl group having 4 to 10 C atoms, where one or more H atoms may be replaced by F. Particular preference is given to compounds of the formula (1) in which the symbol R, identically or differently on each occurrence, stands for $Si(R^2)_3$, $B(OR^2)_2$, a branched alkyl group having 4, 5 or 6 C atoms or a cyclic alkyl group having 5 to 10 C atoms, where in each case one or more H atoms may also be replaced by F. Very particularly preferred groups $Si(R^2)_3$ are $Si(Me)_3$, $Si(Me)_2(t\text{-Bu})$, $SiMe(t\text{-Bu})_2$ and $Si(i\text{-Pr})_3$.

Preference is furthermore given to compounds in which the group R does not contain any benzylic protons, i.e. does not contain any protons bonded to an aliphatic carbon atom which is bonded directly to the phenyl group. Preference is furthermore given to compounds in which the C atom of the group R which is bonded directly to the phenyl group is a bridgehead atom. If R stands for an alkyl group, the carbon atom which is bonded directly to the phenyl group is thus preferably a quaternary C atom.

Preference is furthermore given to compounds of the formula (1) in which the symbol $R^1$, identically or differently on each occurrence, stands for F, $Si(R^2)_3$, $B(OR^2)_2$, a straight-chain alkyl or alkoxy group having 1 to 6 C atoms or a branched or cyclic alkyl or alkoxy group having 3 to 10 C atoms, where in each case one or more $CH_2$ groups may be replaced by $-R^2C=CR^2-$, $Si(R^2)_2$, $-O-$, $-S-$ or $-N(R^2)-$ and where in each case one or more H atoms may be replaced by F, or an aryl or heteroaryl group having 5 to 14 aromatic ring atoms, or a combination of two or three of these systems; two or more adjacent radicals $R^1$ here may also form a mono- or polycyclic, aliphatic ring system with one another.

Particularly preferred radicals R¹ are selected from the group consisting of F, Si(R²)₃, B(OR²)₂, straight-chain alkyl groups having 1 to 4 C atoms, branched alkyl groups having 3 to 5 C atoms or cyclic alkyl groups having 5 to 10 C atoms, where in each case one or more H atoms may be replaced by F, or monovalent aryl or heteroaryl groups having 6 to 10 aromatic ring atoms, or a combination of two of these systems.

Preference is furthermore given to compounds of the formula (1) in which the index n, identically or differently on each occurrence, stands for 0, 1, 2 or 3, particularly preferably 0, 1 or 2, very particularly preferably 0 or 1. The index n is particularly preferably 0, i.e. the compound of the formula (1) carries no substituents R¹.

Preference is furthermore given to compounds of the formula (1) in which the index p is equal to 1 on each occurrence.

Preference is furthermore given to compounds of the formula (1) in which the symbols R and, if present, R¹ are all selected to be the same, are compounds which have a three-fold axis of rotation.

Examples of particularly preferred compounds of the formula (1) are compounds (1) to (61) depicted below.

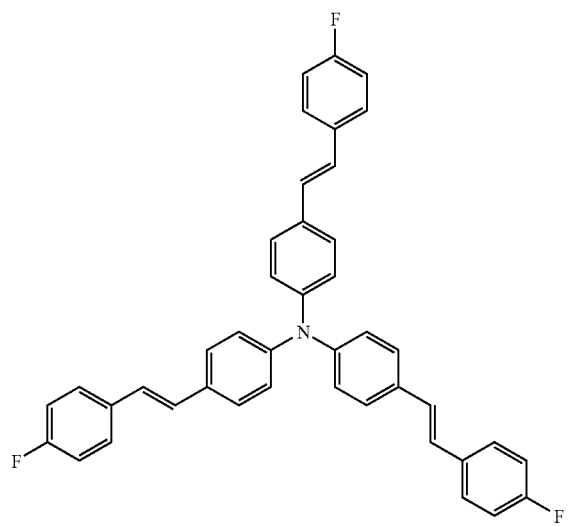
(1)

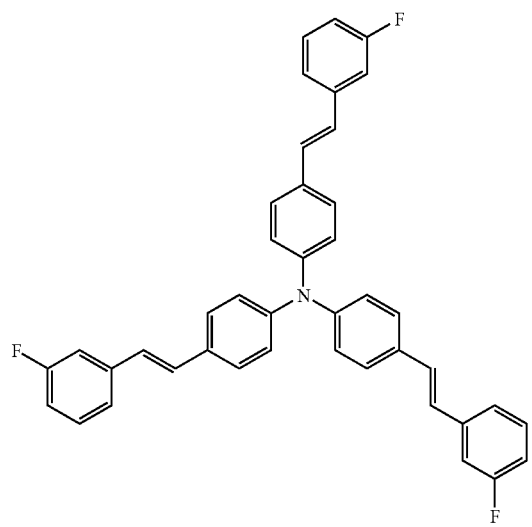
(2)

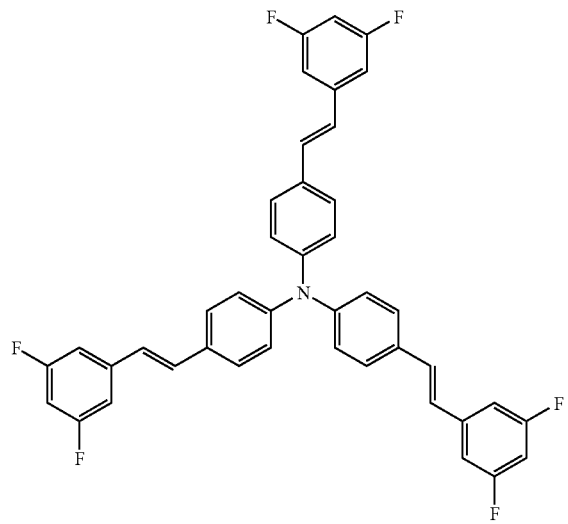
(3)

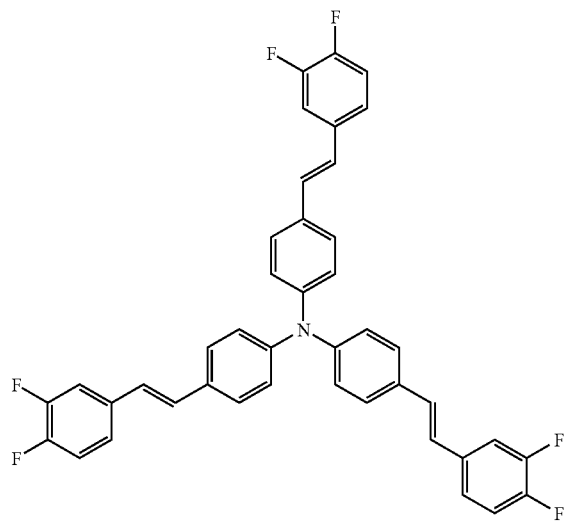
(4)

-continued
(5)
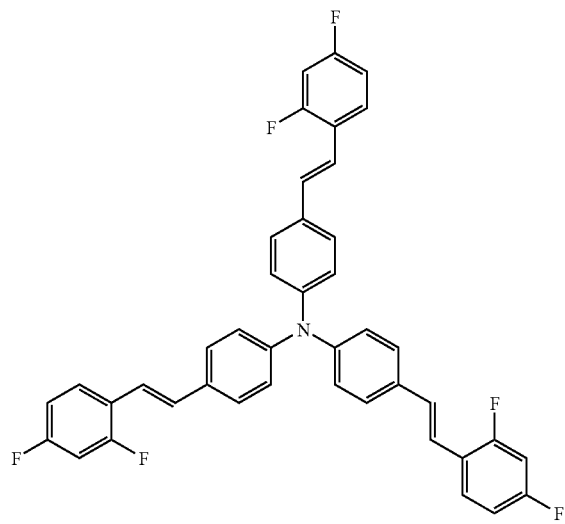
(6)
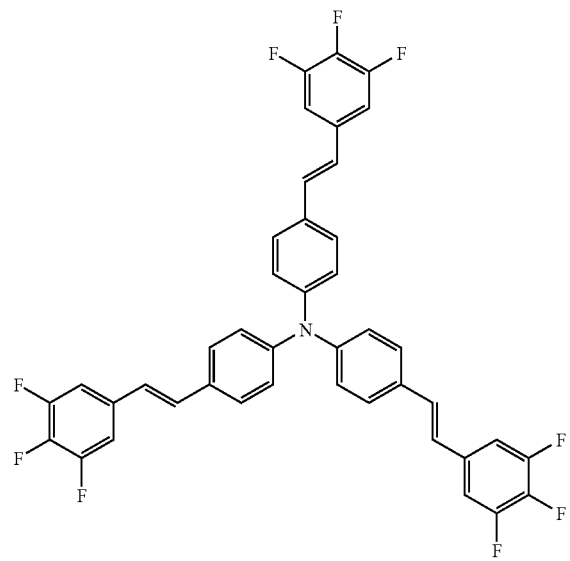
(7)
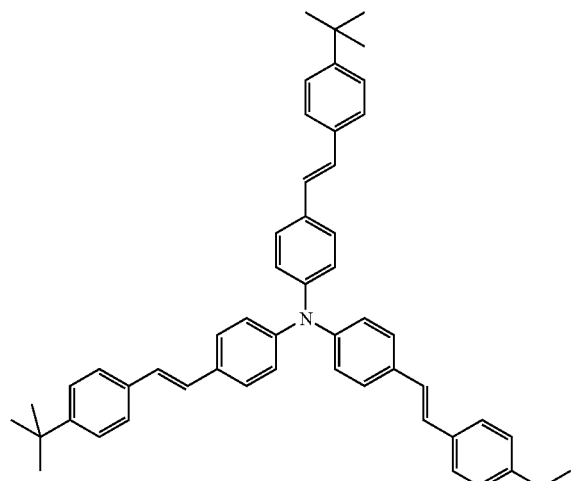
(8)
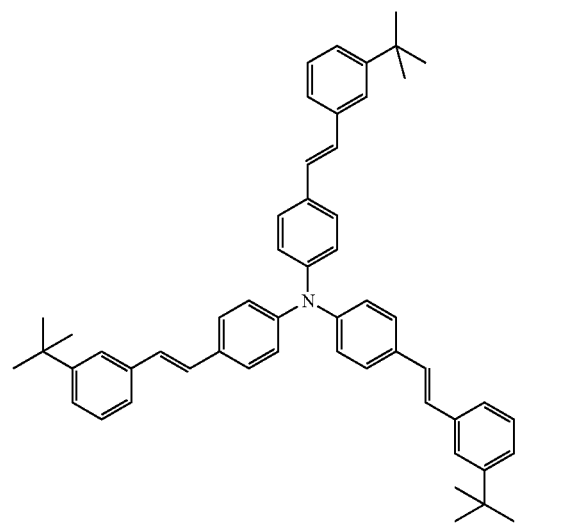
(9)
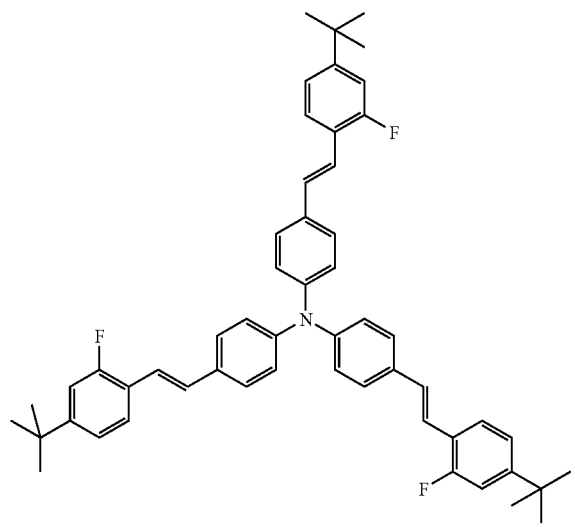
(10)
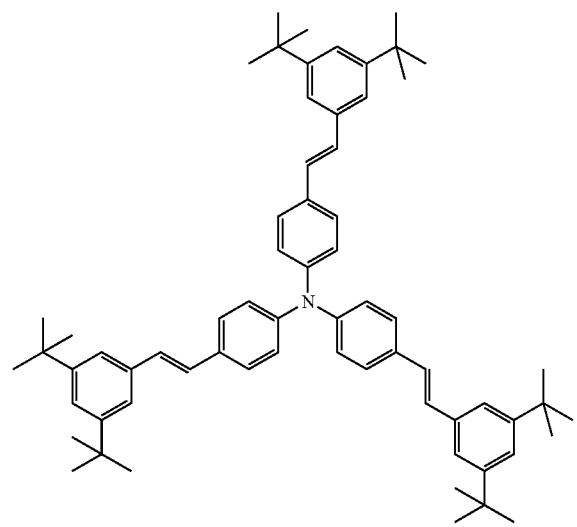

-continued
(11)
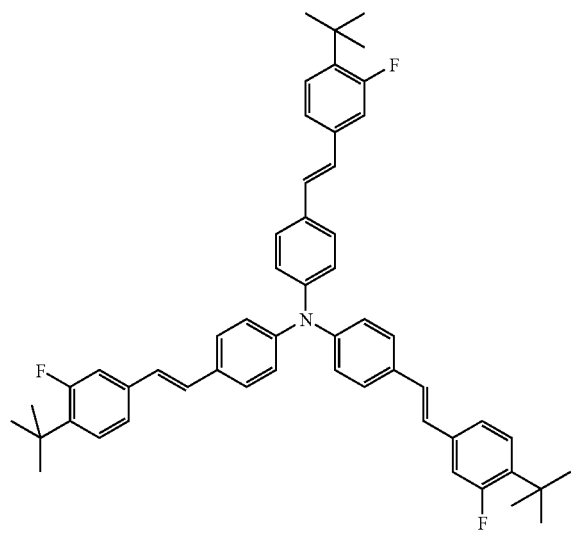
(12)
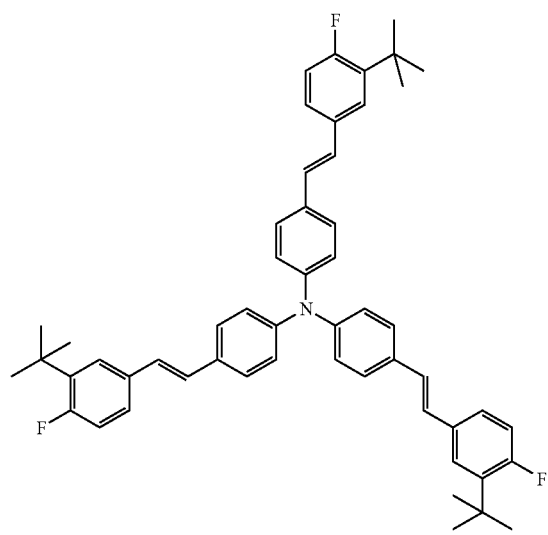
(13)
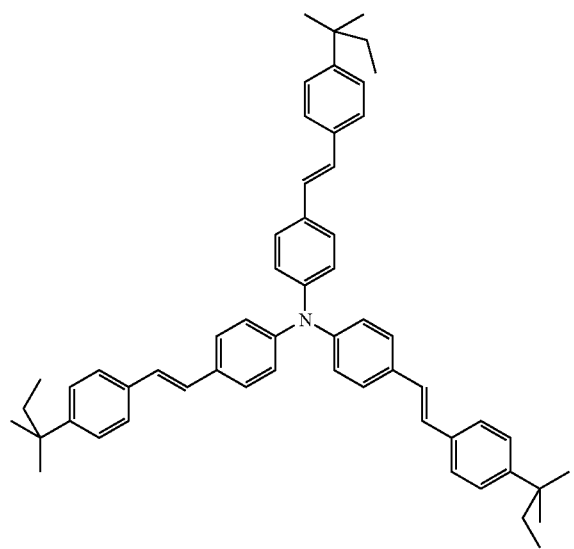
(14)
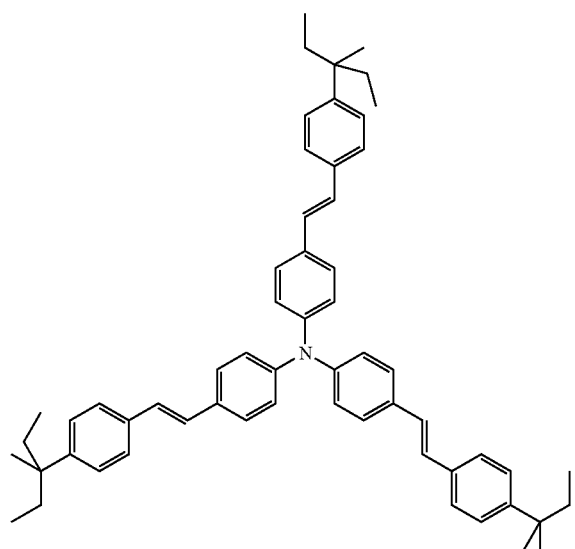

-continued
(15)
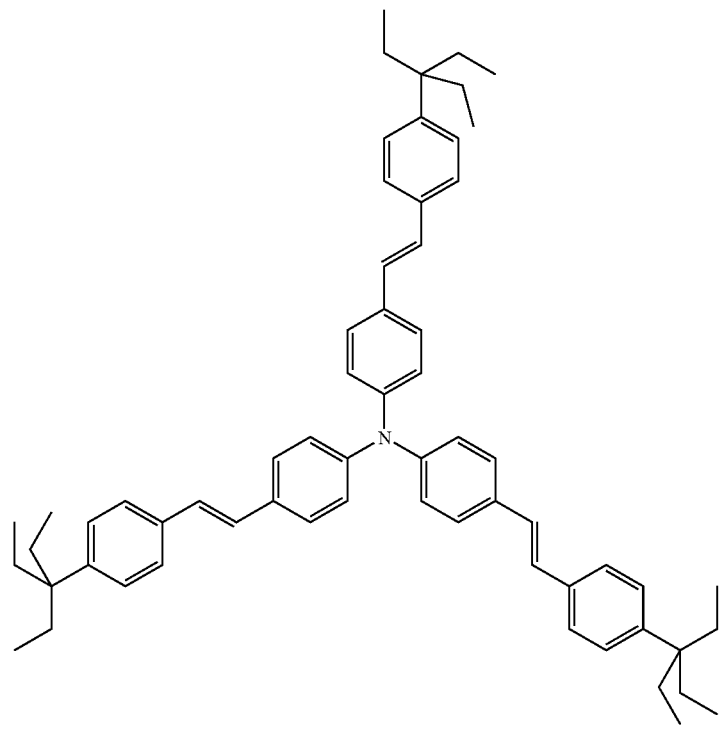
(16)
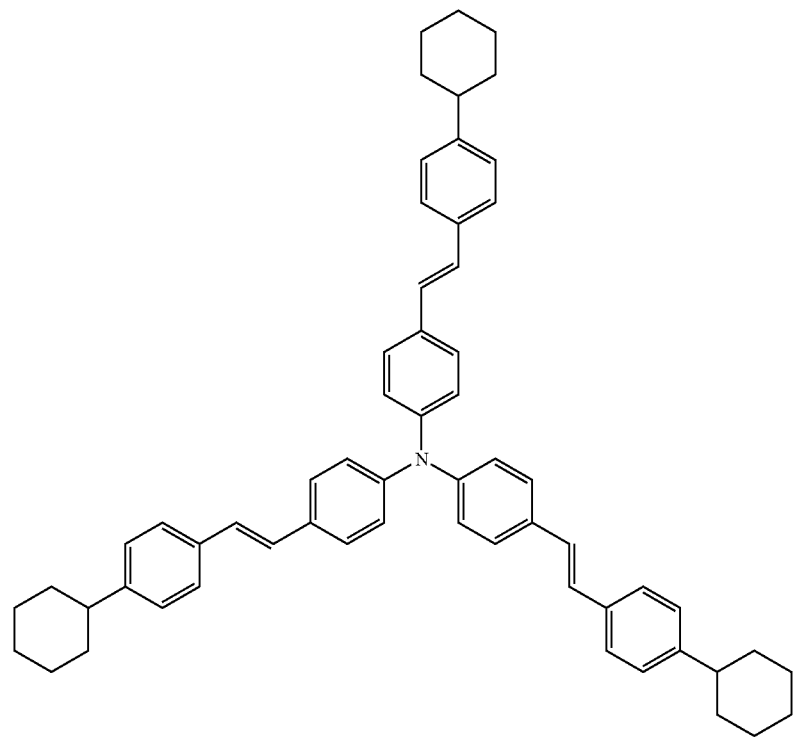

(17)
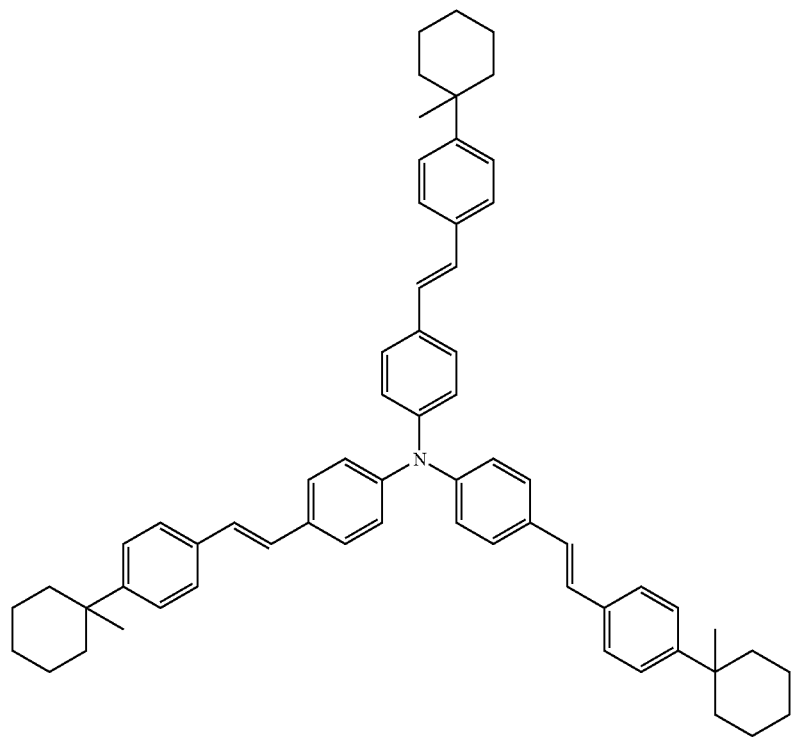
(18)
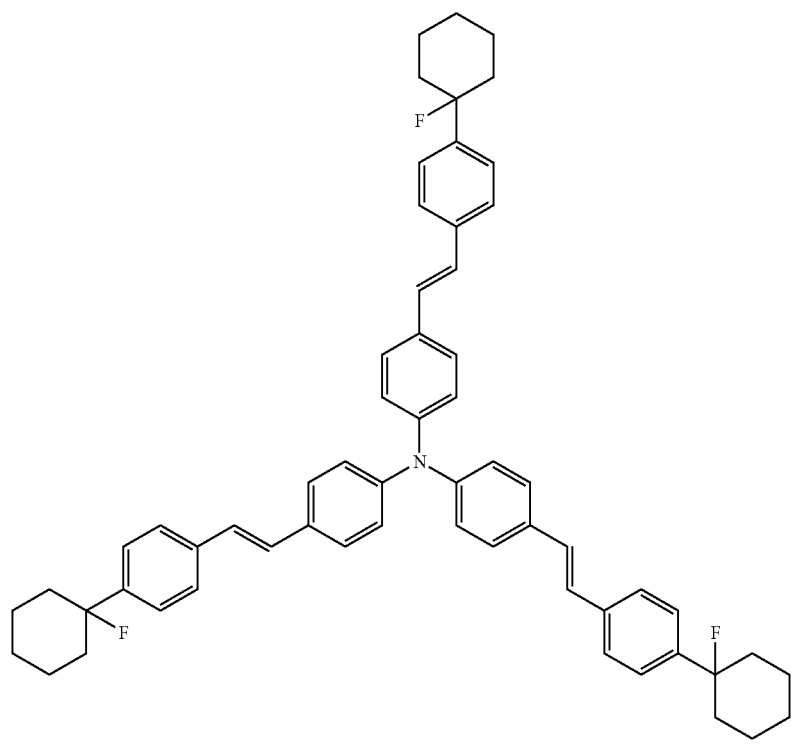

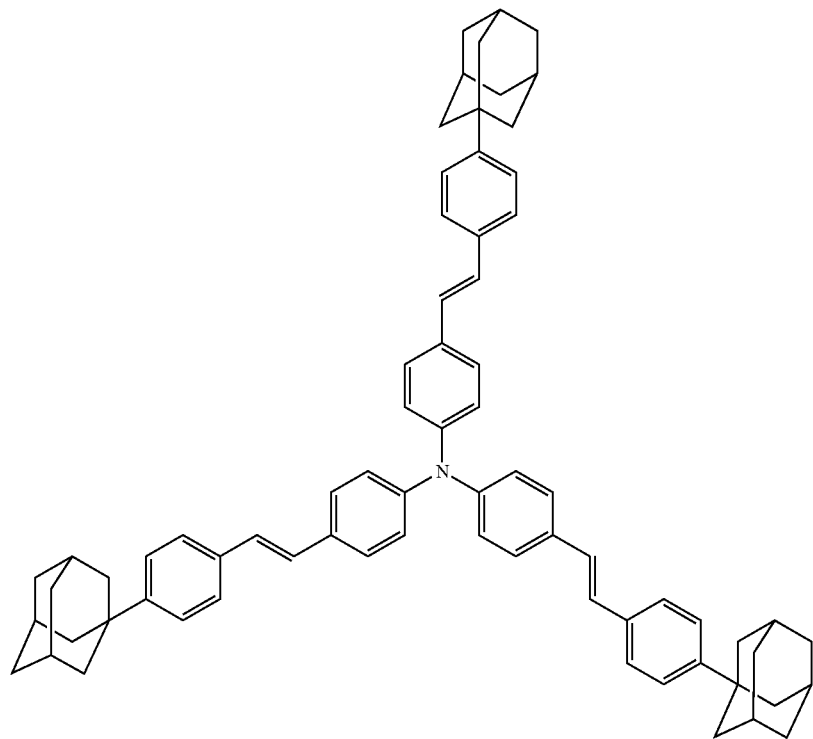
(19)
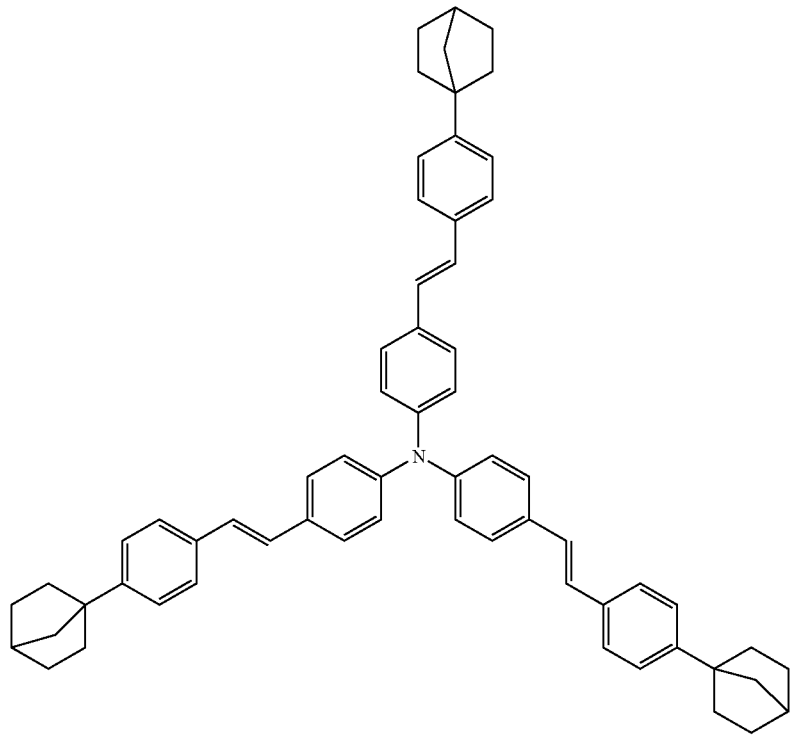
(20)

(21)
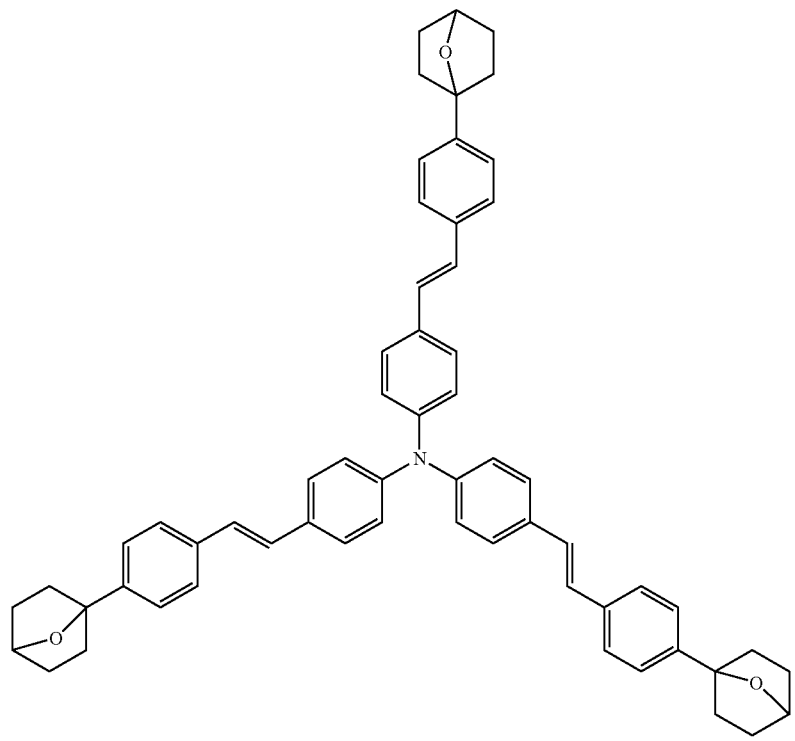
(22)
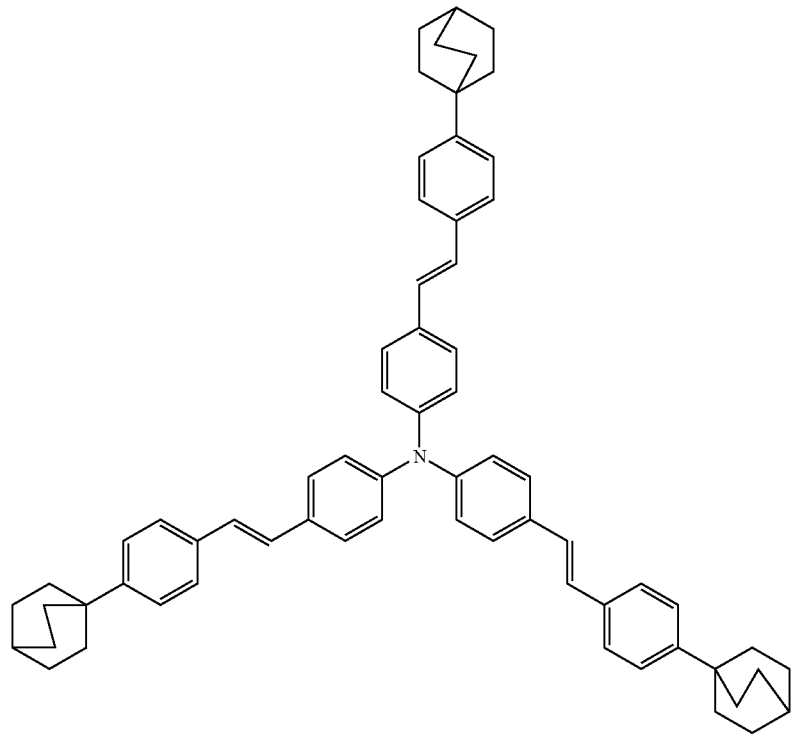

(23)
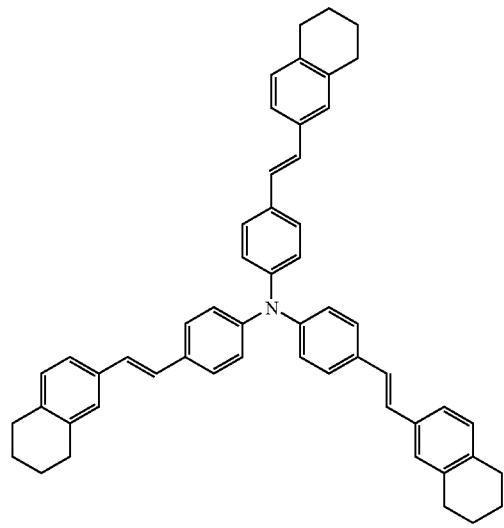
(24)
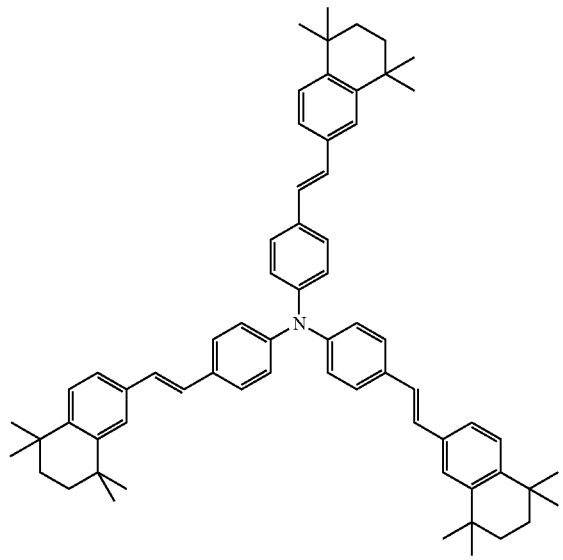
(25)
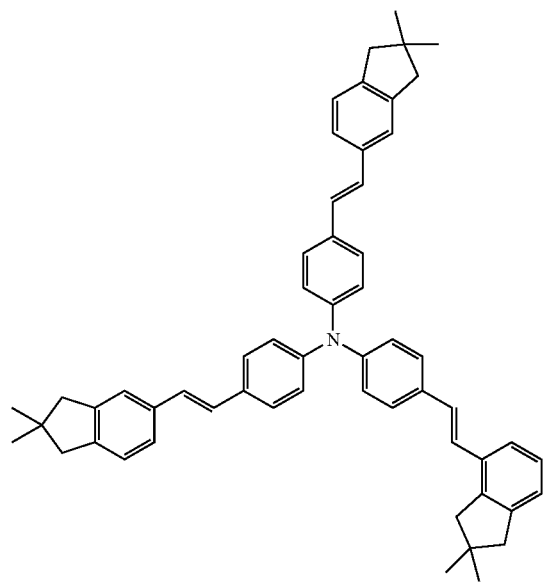
(26)
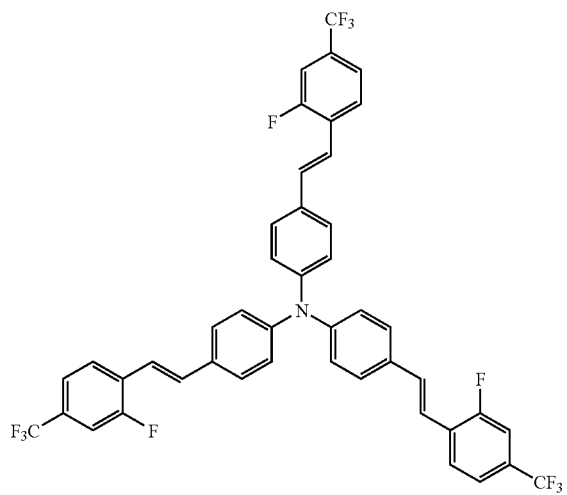

-continued
(27)
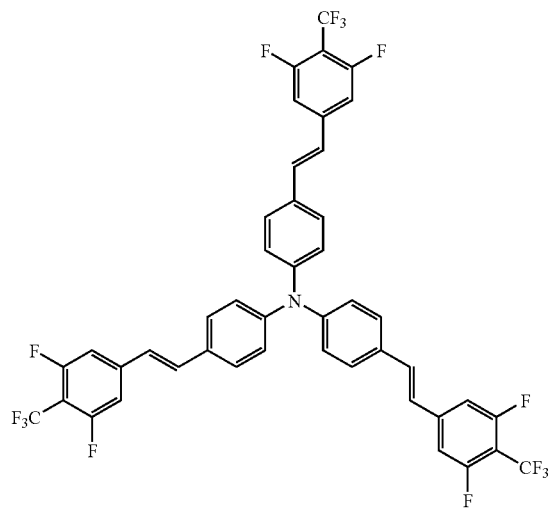
(28)
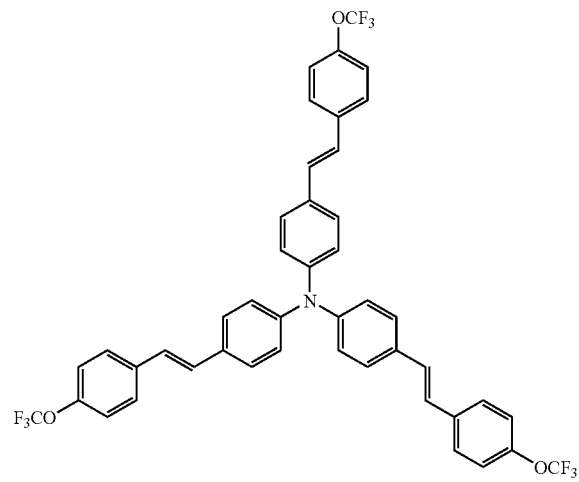
(29)
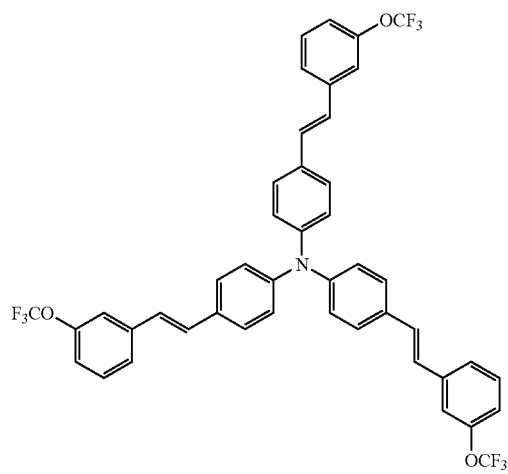
(30)
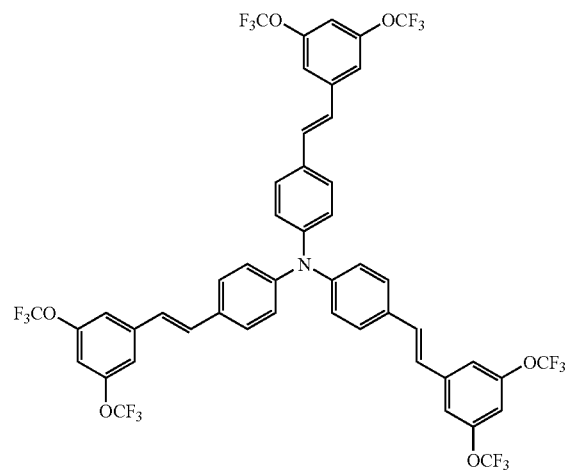
(31)
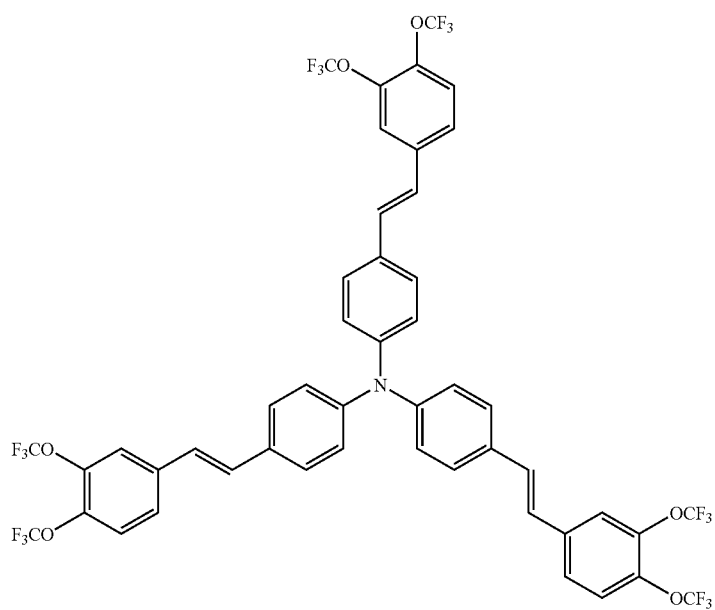

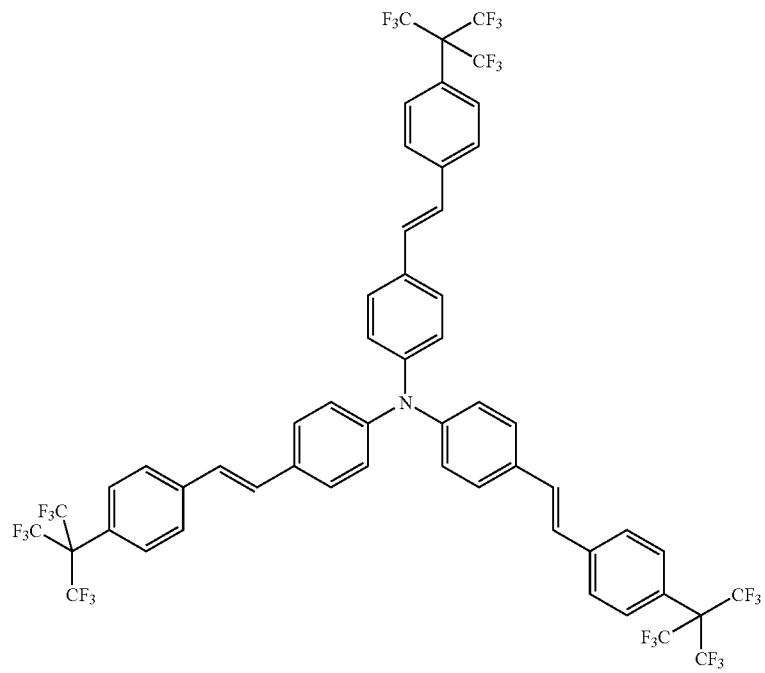
(32)
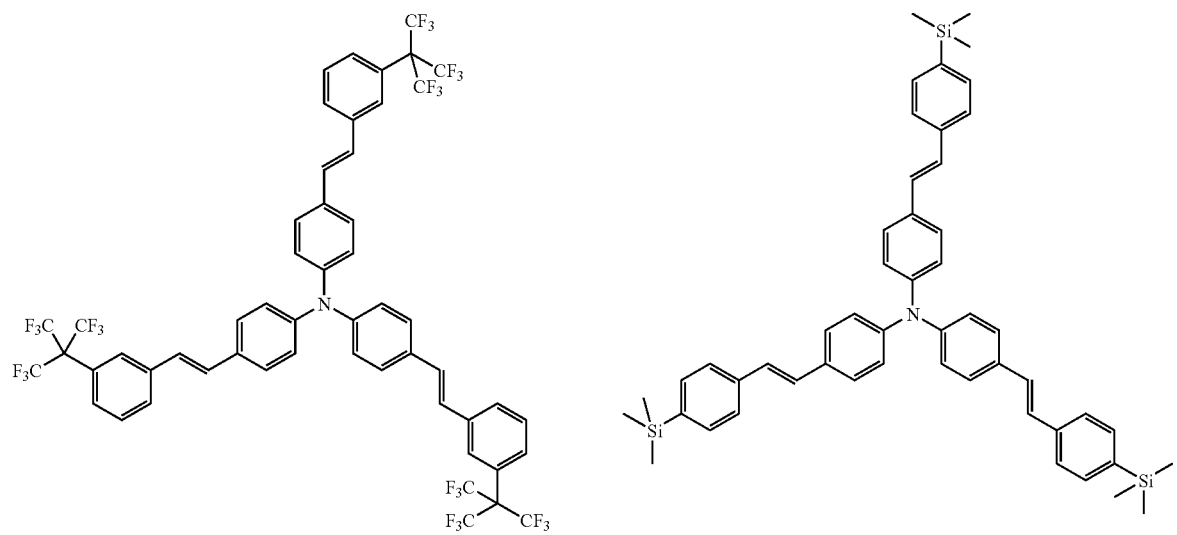
(33)
(34)

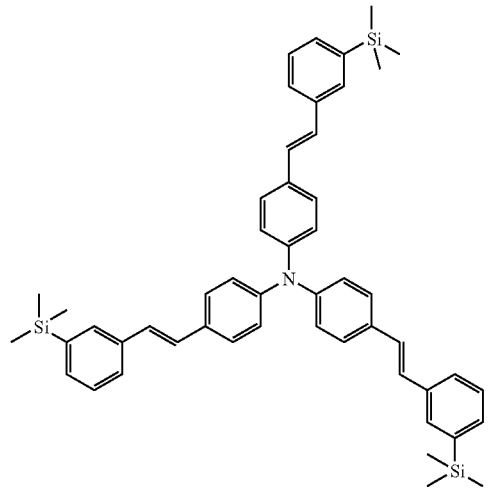
(35)
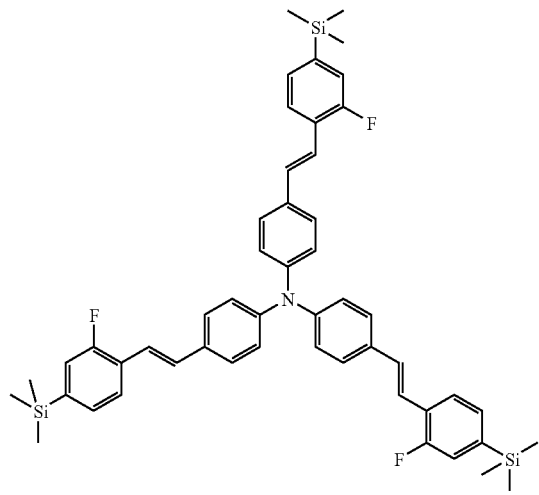
(36)
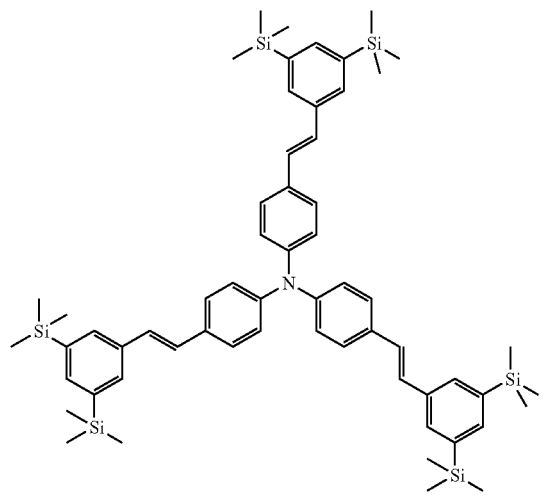
(37)
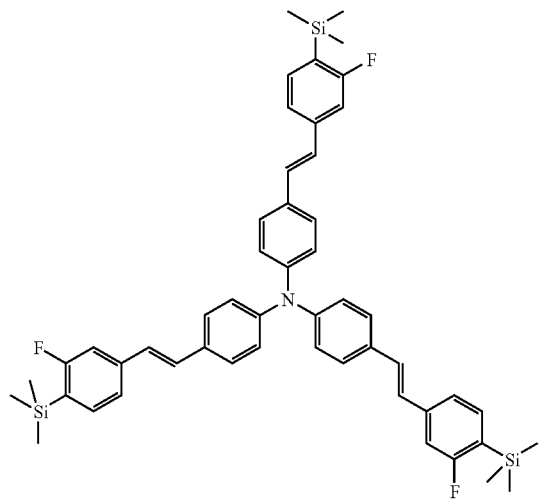
(38)
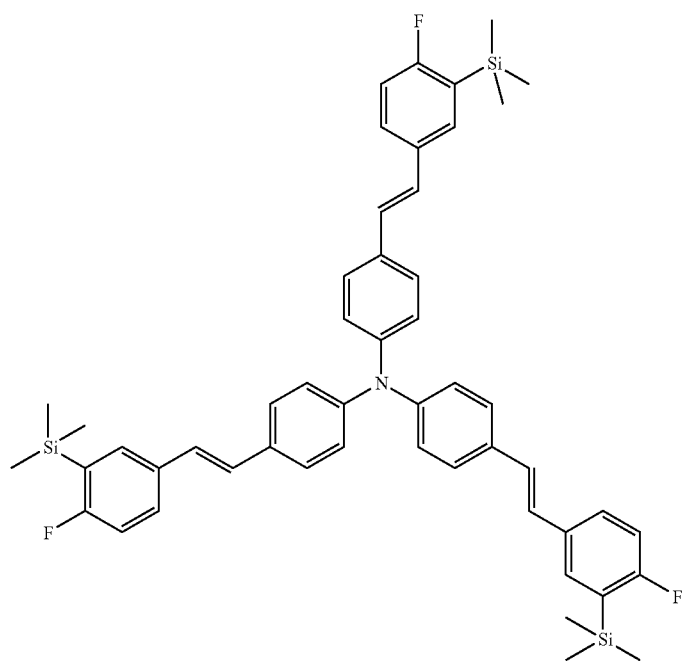
(39)

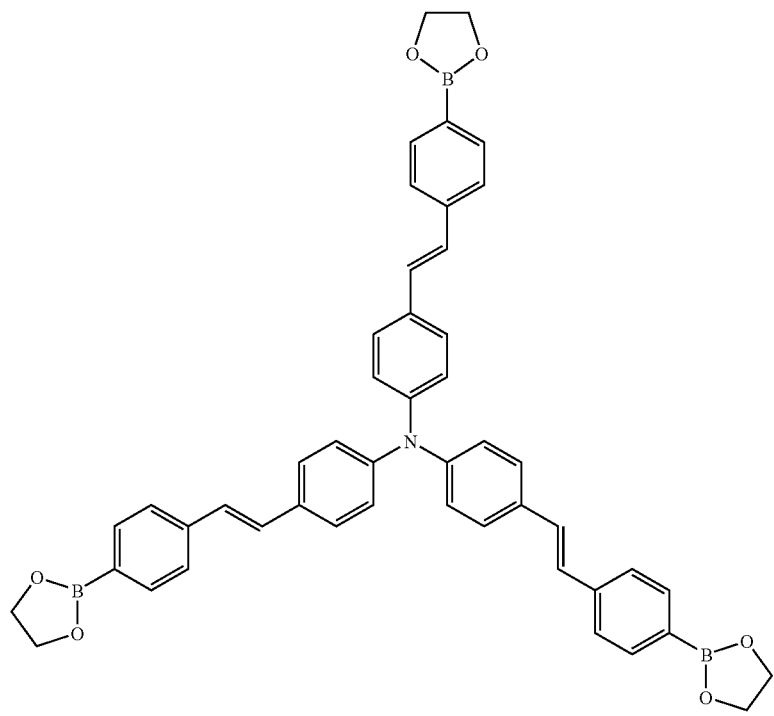
(40)
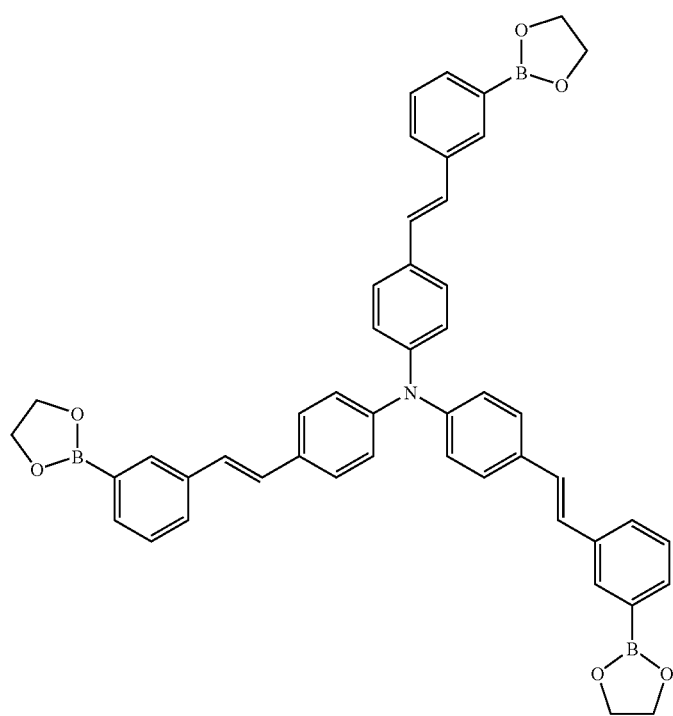
(41)

(42)
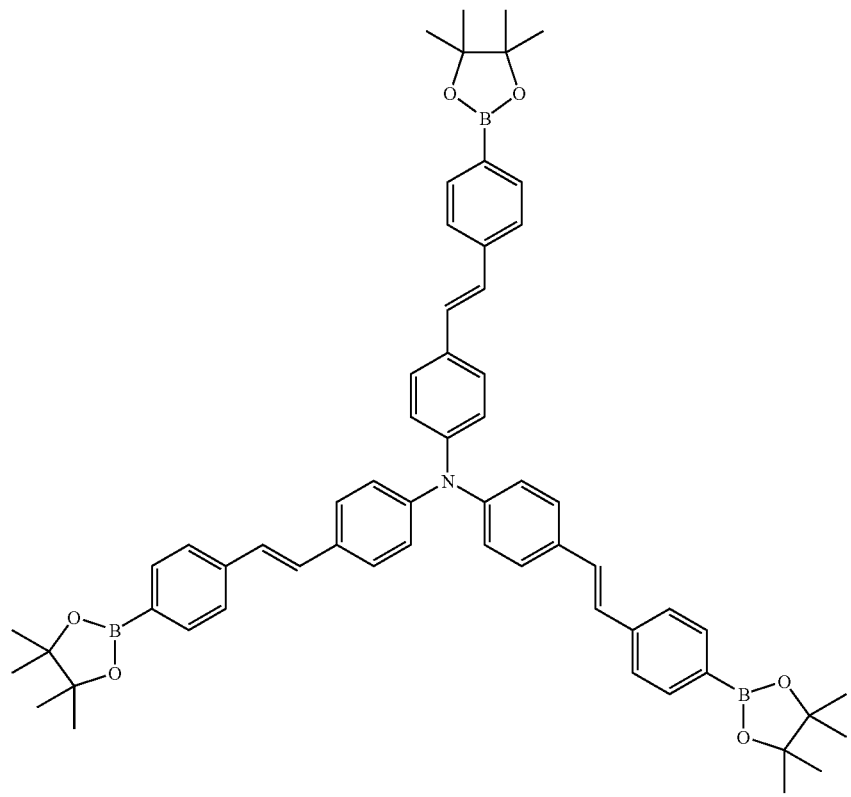
(43)
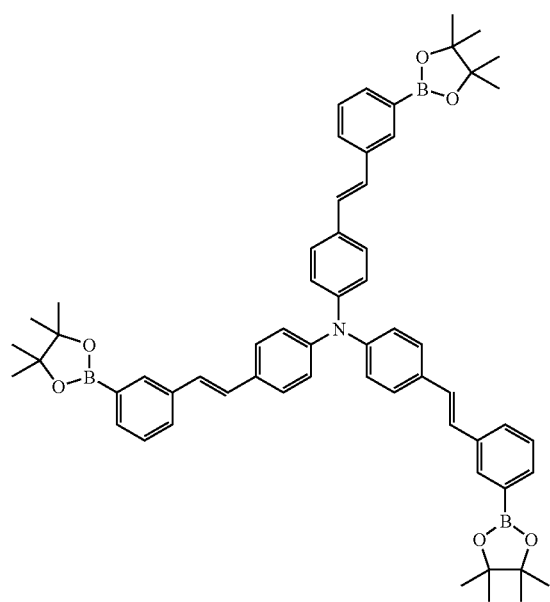
(44)
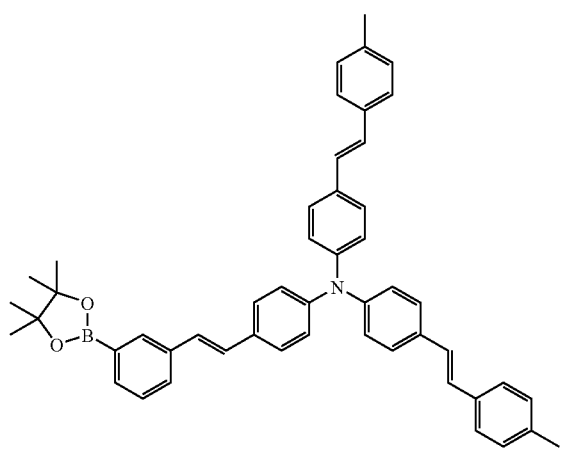

(45)
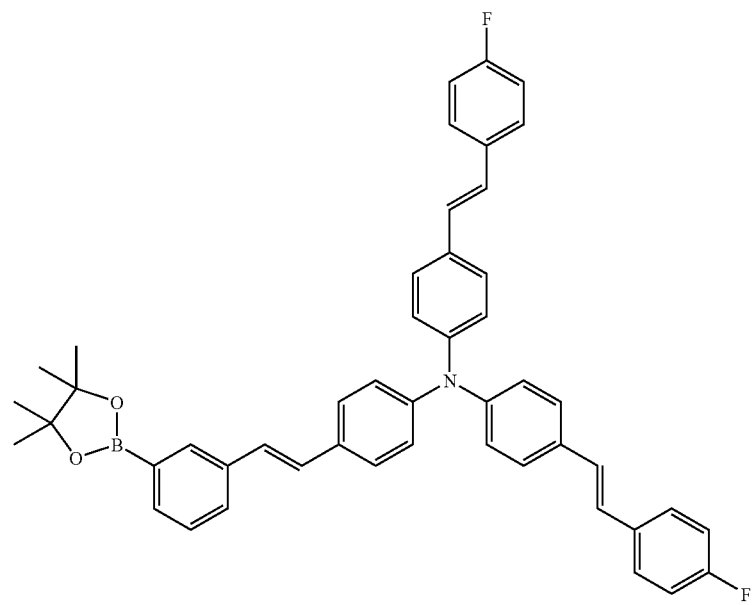
(46)
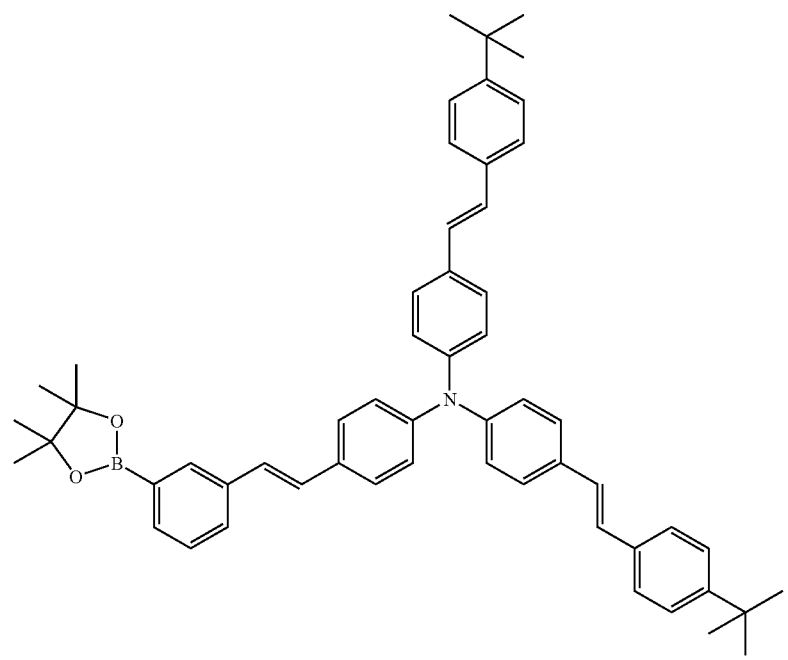

(47)
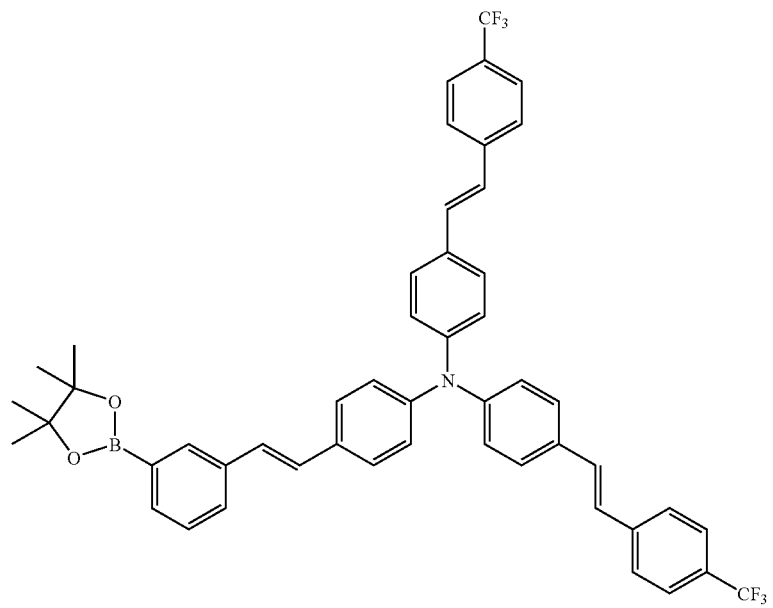
(48)
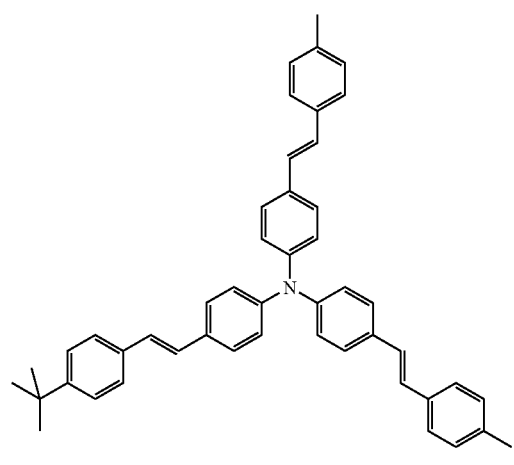
(49)
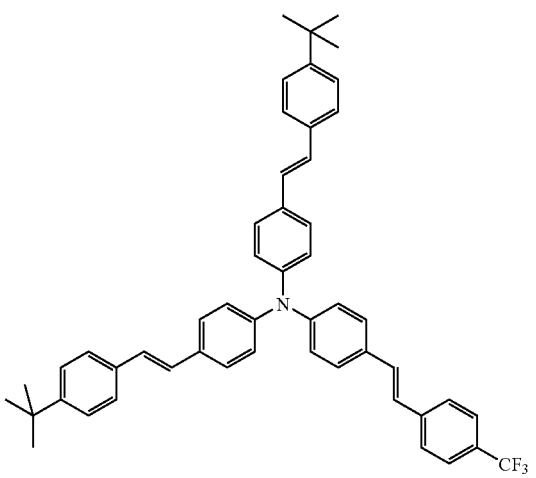
(50)
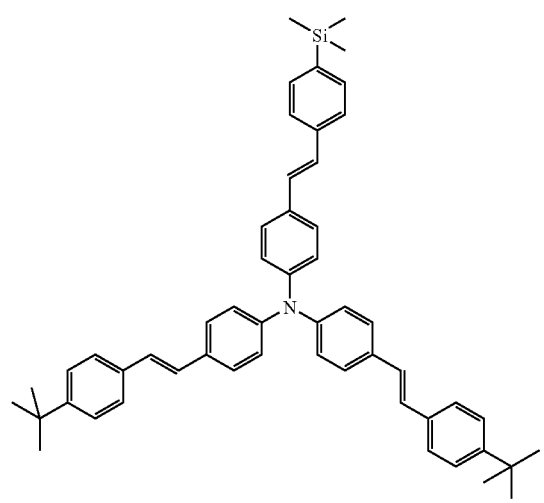
(51)
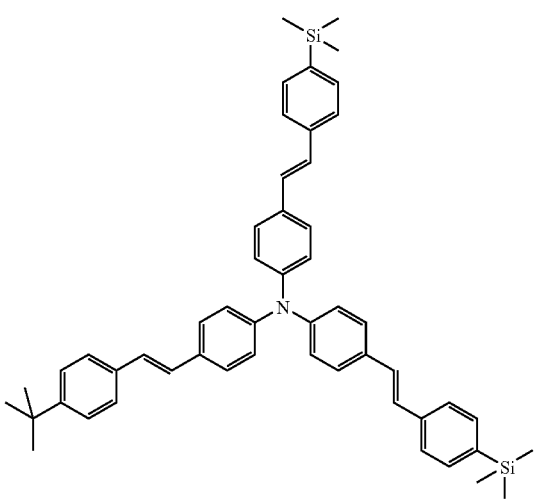

-continued
(52)
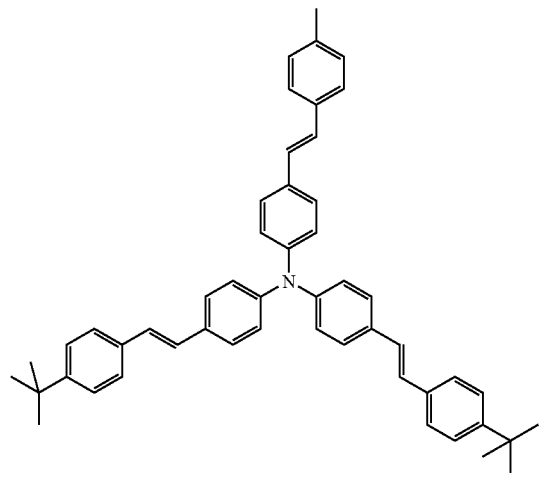
(53)
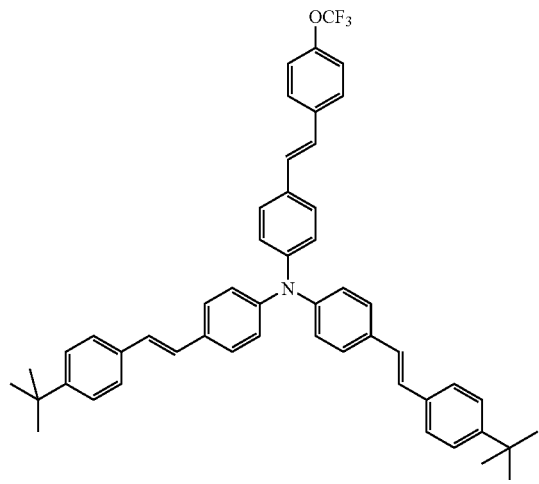
(54)
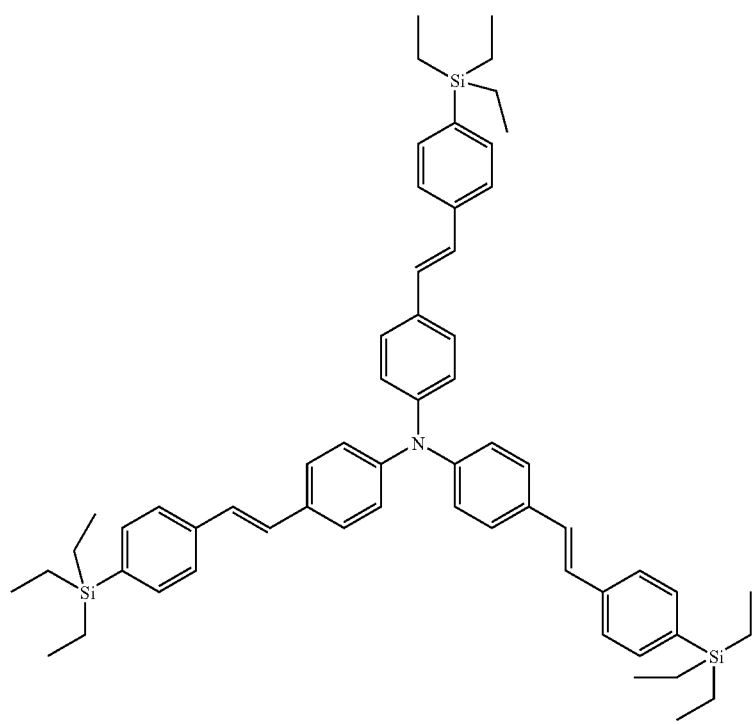

(55)
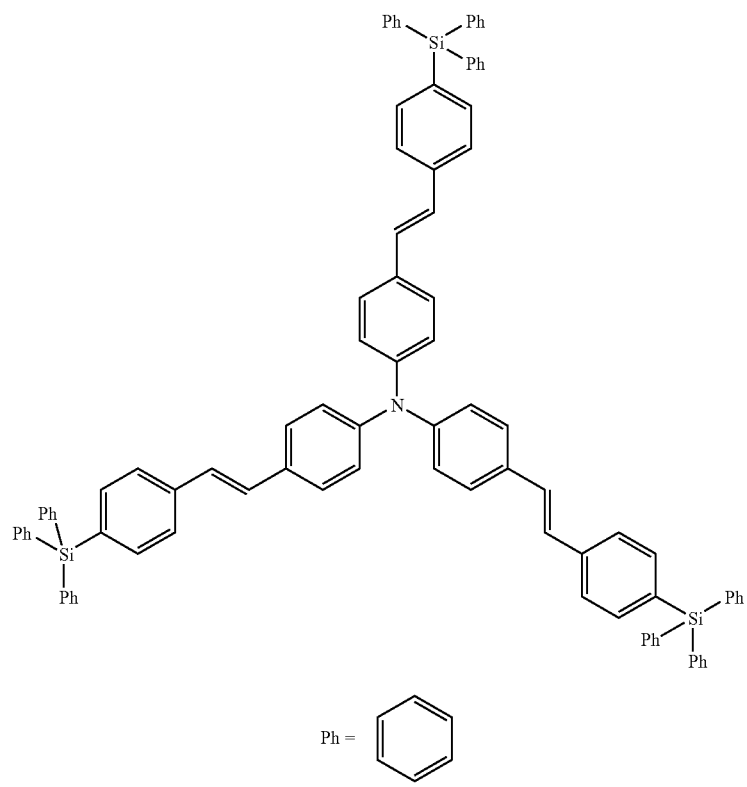
Ph = ⌬
(56)
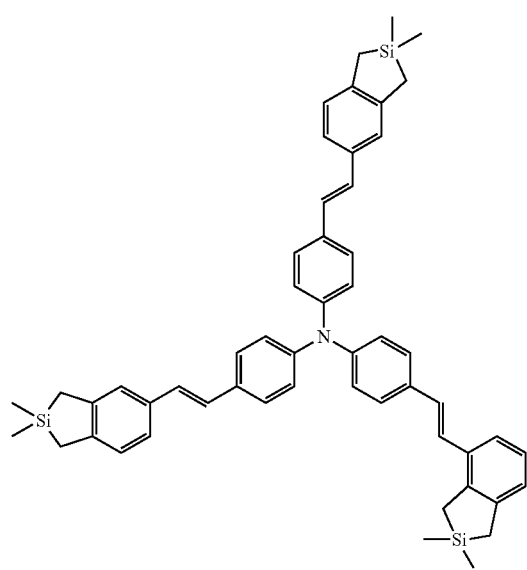
(57)
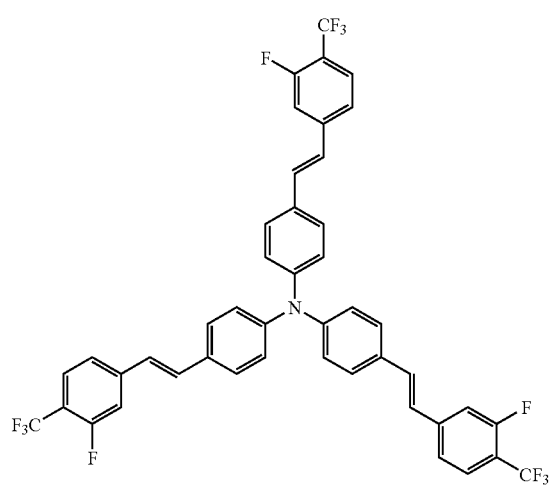

-continued
(58)
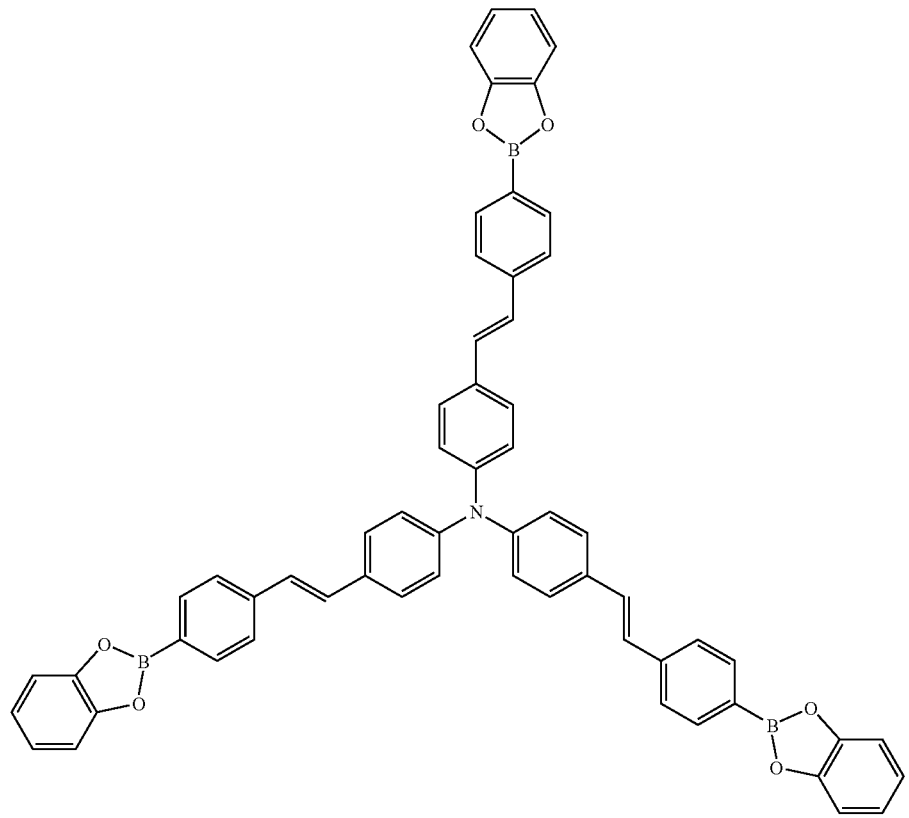
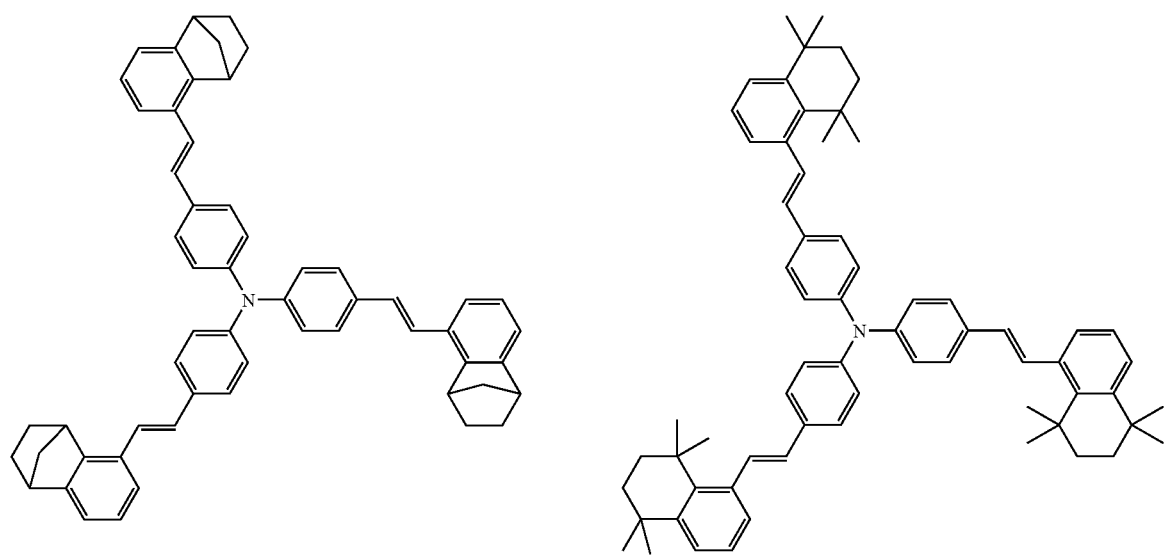

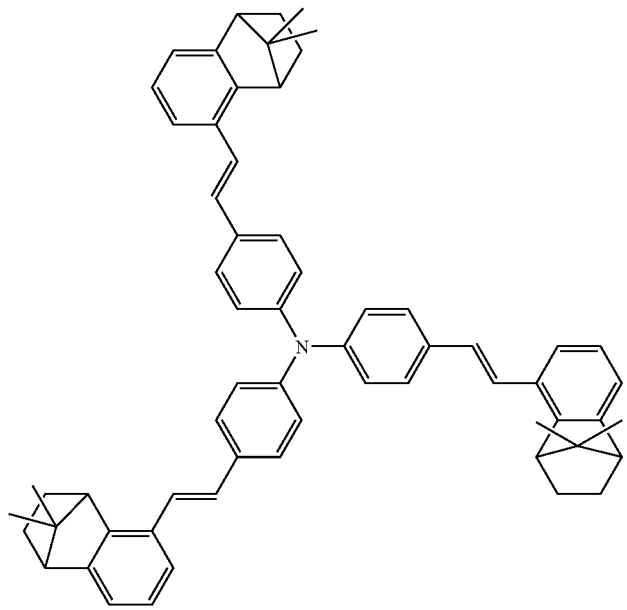

(61)

The compounds of the formula (1) are preferably used in the emitting layer, particularly preferably as a mixture with a host material. Suitable host materials are various classes of substance. Preferred host materials are selected from the classes of the oligoarylenes (for example 2,2',7,7'-tetraphenylspirobifluorene in accordance with EP 676461 or dinaphthyl-anthracene), in particular oligoarylenes containing condensed aromatic groups, oligoarylenevinylenes (for example DPVBi (bisdiphenylvinylbiphenyl) or spiro-DPVBi in accordance with EP 676461), polypodal metal complexes (for example in accordance with WO 04/081017), hole-conducting compounds (for example in accordance with WO 04/058911), in particular triarylamine derivatives and carbazole derivatives, electron-conducting compounds, in particular ketones, phosphine oxides, sulfoxides, etc. (for example in accordance with WO 05/084081 and WO 05/084082), atropisomers (for example in accordance with WO 06/048268), ansa compounds (for example in accordance with the unpublished application EP 05005709.0), cycloalkylphenylanthracenes (for example in accordance with the unpublished application DE 102005026651.7) or boronic acid derivatives (for example in accordance with the unpublished application EP 05009643.7). Particularly preferred host materials are selected from the classes of the oligoarylenes containing naphthalene, anthracene, pyrene and/or perylene or atropisomers of these compounds, ketones, phosphine oxides, sulfoxides and boronic acid derivatives. Very particularly preferred host materials are selected from the classes of the oligoarylenes containing anthracene and/or pyrene or atropisomers of these compounds, and phosphine oxides.

The proportion of the compound of the formula (1) in the mixture is between 0.1 and 99.0% by weight, preferably between 0.5 and 50.0% by weight, particularly preferably between 1.0 and 20.0% by weight, in particular between 1.0 and 10.0% by weight. Correspondingly, the proportion of the host material in the mixture is between 1.0 and 99.9% by weight, preferably between 50.0 and 99.5% by weight, particularly preferably between 80.0 and 99.0% by weight, in particular between 90.0 and 99.0% by weight. The term host material is applied to the compound which occurs in the greatest proportion in the mixture of the emitting layer.

Preference is furthermore given to organic electroluminescent devices, characterised in that a plurality of emitting layers are used, where at least one of these layers comprises at least one compound of the formula (1), preferably in combination with a host material. These emission layers particularly preferably have in total a plurality of emission maxima between 380 nm and 750 nm, resulting overall in white emission, i.e. at least one further emitting compound which is able to fluoresce or phosphoresce and emits yellow, orange or red light is also used in the further emitting layer(s). Particular preference is given to three-layer systems, where at least one of these layers comprises at least one compound of the formula (1), preferably in combination with a host material, and where the three layers exhibit blue, green and orange or red emission (for the basic structure see, for example, WO 05/011013).

Apart from the cathode, anode and emitting layer (or emitting layers), the organic electroluminescent device may also comprise further layers. These can be, for example: hole-injection layer, hole-transport layer, electron-transport layer and/or electron-injection layer. These layers may also be doped. However, each of these layers does not necessarily have to be present. Suitable hole-transport materials are, in particular, aromatic amines, as usually used in accordance with the prior art. The hole-trans-port layer may also be p-doped. Suitable electron-transport materials are, for example, metal chelate complexes, for example $AlQ_3$, compounds based on electron-deficient heterocycles, for example triazine derivatives, or compounds containing aromatic ketones or phosphine oxides, as described, for example, in WO 05/084081 and WO 05/084082. The electron-transport layer may also be n-doped, for example $AlQ_3$ doped with Cs. Suitable electron-injection materials are, in particular, fluorides and oxides of the alkali and alkaline earth metals, for example NaF, $BaF_2$, $CaF_2$, LiF or $Li_2O$.

Preference is furthermore given to an organic electroluminescent device, characterised in that one or more layers are coated by means of a sublimation method, in which the materials are vapour-deposited in vacuum sublimation units at a pressure less than $10^{-5}$ mbar, preferably less than $10^{-6}$ mbar, particularly preferably less than $10^{-7}$ mbar.

Preference is likewise given to an organic electroluminescent device, characterised in that one or more layers are coated by means of the OVPD (organic vapour phase deposition) method or with the aid of carrier-gas sublimation. The materials here are applied at a pressure of between $10^{-5}$ mbar and 1 bar.

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermotransfer printing) or ink-jet printing. Soluble compounds of the formula (1) are necessary for this purpose. High solubility can be achieved through suitable substitution of the compounds.

The invention furthermore relates to mixtures comprising at least one compound of the formula (1) and at least one host material.

The invention still further relates to the use of compounds of the formula (1) for the production of organic electroluminescent devices. The invention likewise furthermore relates to the use of mixtures comprising at least one compound of the formula (1) and at least one host material for the production of organic electroluminescent devices.

The compounds of the formula (1) are novel and are therefore likewise a subject-matter of the present invention.

The invention therefore furthermore relates to compounds of the formula (1)

Formula (1)

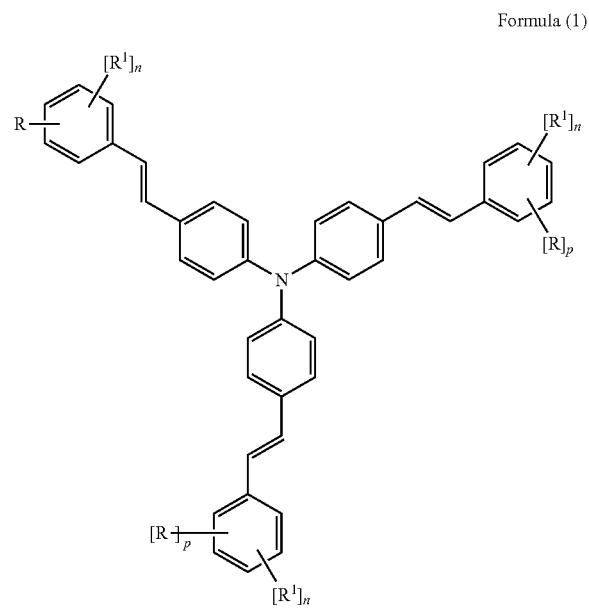

where R, $R^1$, $R^2$, n and p have the same meaning as described above, where the following compound is excluded from the invention:

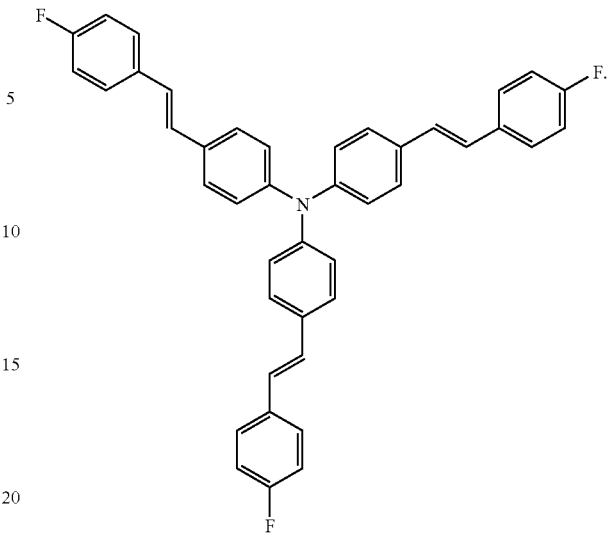

In a preferred embodiment of the invention, the radical R, identically or differently on each occurrence, is $OCF_3$, $Si(R^2)_3$, $B(OR^2)_2$ or a branched or cyclic alkyl, alkoxy or thioalkoxy group having 4 to 10 C atoms, which may be substituted by one or more radicals $R^1$, where one or more non-adjacent $CH_2$ groups may be replaced by —$R^2C$=$CR^2$—, —C≡C—, $Si(R^2)_2$, $Ge(R^2)_2$, $Sn(R^2)_2$, C=O, C=S, C=Se, C=$NR^2$, —O—, —S—, —$N(R^2)$— or —$CONR^2$— and where one or more H atoms may be replaced by F, Cl, Br, I, CN or $NO_2$, or an aryl group having 6 to 16 C atoms, which may be substituted by $R^2$; if R stands for an alkyl, alkoxy or thioalkoxy group, R may also have two bonds to the phenyl group and thus build up a cyclic, condensed ring system.

Preferred compounds of the formula (1) are the preferred embodiments already mentioned above for use in OLEDs.

The compounds of the formula (1) can be synthesised analogously to the compounds in accordance with the prior art. Thus, for example, they can be synthesised by Heck coupling of tris(4-bromophenyl)amine to an appropriately substituted styrene derivative. A particularly suitable variant of the Heck coupling is described, for example, in WO 02/10093. Further synthetic variants of the Heck coupling are described in the literature cited in WO 02/10093. This process can be used if the substituent on the styrene derivative does not itself react under the conditions of the Heck coupling. Thus, for example, alkyl-substituted compounds of the formula (1) can be synthesised from alkyl-substituted styrene derivatives by this process. A further process is the Wittig-Horner reaction, in which an appropriately substituted dialkyl benzyl phosphonate, in which the alkyl group preferably has 1 to 10 C atoms, particularly preferably 1 or 2 C atoms, is reacted with tris(4-formylphenyl)amine. Substituted tristilbenamines, for example also bromine-substituted tristilbenamines, are likewise accessible by this process. This bromine substituent may then be replaced by other functional groups in a subsequent step, for example by metallation, for example by conversion into the corresponding Grignard reagent or by lithiation, and can be converted into the corresponding silyl derivative using, for example, a silyl halide and into the corresponding boronic acid derivatives using a borate. The functional group of the compound of the formula (1) may likewise be present directly as substituent on the starting material in this process, for example a silyl group or a boronic acid ester group.

The invention therefore furthermore relates to a process for the synthesis of compounds of the formula (1), characterised in that tris(4-bromophenyl)-amine is reacted with an appropriately substituted styrene derivative in a Heck coupling or in that tris(4-formylphenyl)amine is reacted with an appropriately substituted dialkyl benzyl phosphonate, optionally followed by conversion of the original substituent into the target substituent.

The invention still further relates to the use of compounds of the formula (1) in organic field-effect transistors (O-FETs), organic thin-film transistors (O-TFTs), organic light-emitting transistors (O-LETs), organic integrated circuits (O-ICs), organic solar cells (O-SCs), organic field-quench devices (O-FQDs), light-emitting electrochemical cells or organic laser diodes (O-lasers).

The organic electroluminescent devices according to the invention have the following surprising advantage over the prior art: the stability of the devices becomes higher compared with systems in accordance with the prior art, which is evident, in particular, from a significantly longer lifetime. This result is particularly surprising since OLEDs comprising tristilbenamines which are unsubstituted or substituted by similar substituents, for example methyl or isopropyl groups, have a shorter lifetime. The devices according to the invention furthermore exhibit improved dark-blue colour coordinates compared with devices which comprise tristilbenamine derivatives in accordance with the prior art.

The invention is explained in greater detail by the examples below without wishing to restrict it thereby.

EXAMPLES

The following syntheses are carried out under a protective-gas atmosphere, unless indicated otherwise. The starting materials can be purchased from ALDRICH (tris(4-bromophenyl)amine, 4-tert-butylstyrene, 4-fluorostyrene, palladium(II) acetate, N,N-dimethylglycine, inorganics, solvents) and from Epsilon Chimie Products (diethyl 4-bromobenzyl phosphonate). Tris(4-formylphenyl)amine can be prepared as described in *Synthesis* 2005, 11, 1771. Tris[(phenylvinyl)phenyl]amine can be synthesised as described in *Macromolecules* 1996, 29, 7705. 4-Trifluoromethoxy-styrene can be prepared as described in *J. Org. Chem.*, 1964, 29, 1. 6-Ethenyl-1,2,3,4-tetrahydro-1,1,4,4-tetramethylnaphthalene can be pre-pared as described in *J. Med. Chem.* 1989, 32, 1504.

Example 1

Tris(phenylvinylphenyl)amine (Dopant D1, Comparison)

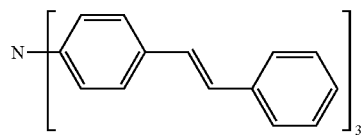

A mixture of 24.1 g (50 mmol) of tris(4-bromophenyl)amine, 25.8 ml (225 mmol) of styrene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloromethane and 1000 ml of water are added. The organic phase is separated off and washed five times with 500 ml of water each time. After drying over sodium sulfate, the organic phase is evaporated to dryness. The yellow solid obtained in this way is recrystallised six times from toluene, then washed twice by stirring with 500 ml of ethanol under reflux each time and subsequently sublimed three times under reduced pressure (T=350° C., p=5×10$^{-5}$ mbar), giving 18.8 g (34 mmol) (corresponding to 68.1% of theory) of the product having a purity of greater than 99.5% according to HPLC.

Example 2

Tris[4-(methylphenylvinyl)phenyl]amine (Dopant D2, Comparison)

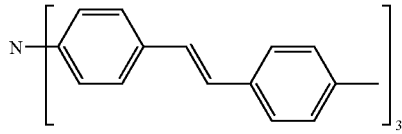

A mixture of 24.1 g (50 mmol) of tris(4-bromophenyl)amine, 29.6 ml (225 mmol) of 4-methylstyrene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloromethane and 1000 ml of water are added. The organic phase is separated off and washed five times with 500 ml of water each time. After drying over sodium sulfate, the organic phase is evaporated to dryness. The yellow solid obtained in this way is recrystallised six times from toluene, then washed twice by stirring with 500 ml of ethanol under reflux each time and subsequently sublimed three times under reduced pressure (T=350° C., p=5×10$^{-5}$ mbar), giving 15.7 g (26 mmol) (corresponding to 52.8% of theory) of the product having a purity of greater than 99.5% according to HPLC.

Example 3

Tris[4-(tert-butylphenylvinyl)phenyl]amine (Dopant D3)

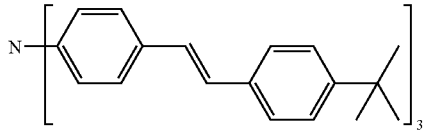

A mixture of 24.1 g (50 mmol) of tris(4-bromophenyl)amine, 42.4 ml (225 mmol) of 4-tert-butylstyrene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloro-methane and 1000 ml of water are added. The organic phase is separated off and washed five times with 500 ml of water. After drying over sodium sulfate, the organic phase is evaporated to dryness. The yellow solid obtained in this way is recrystallised four times from dioxane and twice from toluene/n-heptane (2:1, v:v), then washed twice by stirring with 500 ml of ethanol under reflux and subsequently sublimed three times under reduced pressure (T=330° C., p=5×10$^{-5}$ mbar), giving 17.4 g (24 mmol) (corresponding to 48.3% of theory) of the product having a purity of greater than 99.5% according to HPLC.

Example 4

Tris(4-(trimethylsilylphenylvinyl)phenyl)amine (Dopant D4)

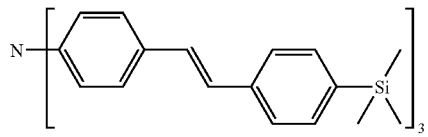

a) Tris(4-bromophenylvinylphenyl)amine 112.5 g (1.17 mol) of sodium tert-butoxide are added with vigorous stirring to a mixture, cooled to 0° C., of 179.7 g (585 mmol) of diethyl (4-bromo-benzyl) phosphonate and 1000 ml of DMF. The mixture is stirred at 0° C. for a further 30 min., and a solution of 49.6 g (150 mmol) of tris(4-formylphenyl) amine in 1000 ml of DMF is then added dropwise. The mixture is stirred at 0 to 5° C. for a further 3 h and then hydrolysed with ice-cooling by addition of a mixture of 250 ml of 2.5M HCl, 600 ml of water and 200 ml of ethanol. The precipitated solid is filtered off with suction, washed three times with 300 ml of ethanol/water (1:1, v:v) each time and three times with 300 ml of ethanol each time and dried under reduced pressure. The solid is recrystallised from 300 ml of DMF, subsequently washed with 500 ml of boiling ethanol and dried under reduced pressure. Yield 97.2 g (123 mmol) (corresponding to 82.1% of theory) with a purity of 99.0% according to NMR.

b) Tris(4-(trimethylsilylphenylvinyl)phenyl)amine 100 ml (250 mmol) of n-BuLi (2.5M in n-hexane) are added dropwise at room temperature to a vigorously stirred suspension of 39.4 g (50 mmol) of tris(4-bromophenylvinylphenyl)amine in 1000 ml of diethyl ether, and the mixture is stirred at room temperature for a further 3 h. The solution obtained in this way is cooled to −78° C., a mixture of 57.5 ml (450 mmol) of chlorotrimethylsilane in 100 ml of diethyl ether is added, and the mixture is slowly warmed to room temperature. After addition of 500 ml of water, the organic phase is separated off, dried over magnesium sulfate and evaporated. The yellow solid obtained in this way is recrystallised five times from toluene/acetonitrile and subsequently sublimed three times under reduced pressure (T=310° C., p=5×10$^{-5}$ mbar), giving 23.6 g (31 mmol) (corresponding to 61.4% of theory) of the product having a purity of greater than 99.5% according to HPLC.

Example 5

Tris[((4-boronic Acid Pinacol Ester)phenylvinyl)phenyl]-amine (Dopant D5)

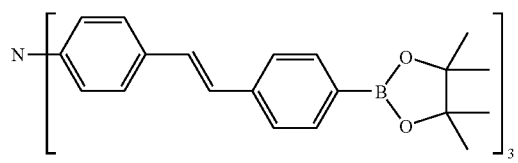

100 ml (250 mmol) of n-BuLi (2.5M in n-hexane) are added dropwise at room temperature to a vigorously stirred suspension of 39.4 g (50 mmol) of tris(4-bromophenylvinylphenyl)amine (from Example 4a) in 1000 ml of diethyl ether, and the mixture is stirred at room temperature for a further 3 h. The solution obtained in this way is cooled to −78° C., a mixture of 50.2 ml (450 mmol) of trimethyl borate in 100 ml of diethyl ether is added, and the mixture is slowly warmed to room temperature. After addition of a mixture of 40 ml of acetic acid and 500 ml of water and stirring for a further 30 min., the organic phase is separated off and evaporated. The yellow solid obtained in this way is suspended in 500 ml of toluene, 17.7 g (150 mmol) of pinacol are added, and the mixture is boiled until the separation of water is complete. The oil obtained after removal of the toluene is recrystallised five times from toluene/acetonitrile and subsequently sublimed three times under reduced pressure (T=290° C., p=5×10$^{-5}$ mbar), giving 25.1 g (27 mmol) (corresponding to 54.0% of theory) of the product having a purity of greater than 99.0% according to HPLC.

Example 6

Tris[((4-trifluoromethoxy)phenylvinyl)phenyl]amine (Dopant D6)

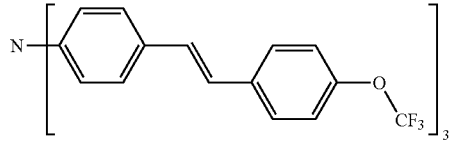

A mixture of 24.1 g (50 mmol) of tris(4-bromophenyl) amine, 30.2 g (225 mmol) of 4-trifluoromethoxystyrene, 337 mg (1.5 mmol) of palladium-(II) acetate, 155 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 24 h. After cooling, 500 ml of dichloromethane and 1000 ml of water are added. The organic phase is separated off and washed five times with 500 ml of water. After drying over sodium sulfate, the organic phase is evaporated to dryness. The yellow solid obtained in this way is recrystallised five times from toluene/ n-heptane (1:1, v:v), then washed twice by stirring with 500 ml of ethanol under reflux and subsequently sublimed three times under reduced pressure (T=280° C., p=5×10⁻⁵ mbar), giving 11.0 g (17 mmol) (corresponding to 34.3% of theory) of the product having a purity of greater than 99.5% according to HPLC.

Example 7

Tris[4-(6-ethenyl-1,2,3,4-tetrahydro-1,1,4,4-tetramethylnaphthalene)phenyl]amine (Dopant D7)

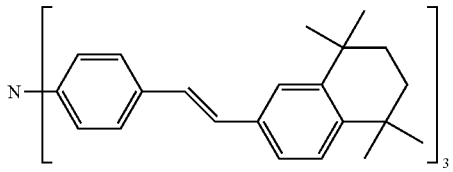

A mixture of 24.1 g (50 mmol) of tris(4-bromophenyl)amine, 48.2 g (225 mmol) of 6-ethenyl-1,2,3,4-tetrahydro-1,1,4,4-tetramethylnaphthalene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloromethane and 1000 ml of water are added. The organic phase is separated off and washed five times with 500 ml of water. After drying over sodium sulfate, the organic phase is evaporated to dryness. The yellow solid obtained in this way is recrystallised five times from dioxane, then washed twice by stirring with 500 ml of ethanol under reflux and subsequently sublimed three times under reduced pressure (T=340° C., p=5×10⁻⁵ mbar), giving 24.7 g (28 mmol) (corresponding to 56.0% of theory) of the product having a purity of greater than 99.5% according to HPLC.

Example 8

Tris[4-(fluorophenylvinyl)phenyl]amine (Dopant D8)

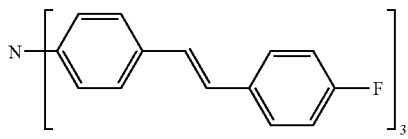

A mixture of 24.1 g (50 mmol) of tris(4-bromophenyl)amine, 26.8 ml (225 mmol) of 4-fluorostyrene, 337 mg (1.5 mmol) of palladium(II) acetate, 1.55 g (15 mmol) of N,N-dimethylglycine, 81 mg (0.5 mmol) of iron(III) chloride and 37.8 g (450 mmol) of sodium hydrogencarbonate in 500 ml of NMP is slowly heated to 140° C. with vigorous stirring and subsequently stirred at this temperature for 16 h. After cooling, 500 ml of dichloromethane and 1000 ml of water are added. The organic phase is separated off and washed five times with 500 ml of water. After drying over sodium sulfate, the organic phase is evaporated to dryness. The yellow solid obtained in this way is recrystallised five times from dioxane, then washed twice by stirring with 500 ml of ethanol under reflux and subsequently sub-limed three times under reduced pressure (T=290° C., p=5×10⁻⁵ mbar), giving 15.4 g (26 mmol) (corresponding to 56.1% of theory) of the product having a purity of greater than 99.5% according to HPLC.

Example 9

Production of OLEDs

OLEDs are produced by a general process as described in WO 04/058911, which is adapted in the individual case to the respective circumstances (for example layer-thickness variation in order to achieve optimum efficiency or colour).

The results for various OLEDs are presented in Examples 10 to 17 below. The basic structure and the materials used (apart from the emitting layer) are identical in the examples for better comparability OLEDs having the following structure are produced analogously to the above-mentioned general process:

| | |
|---|---|
| Hole-injection layer (HIL) | 20 nm PEDOT (spin-coated from water; pruchased from H.C. Starck, Goslar, Germany; poly(3,4-ethylenedioxy-2,5-thiophene)) |
| Hole-transport layer (HTL) | 10 nm 2,2',7,7'-tetrakis(di-para-tolylamino)-spiro-9,9'-bifluorene (abbreviated to HTL-1) |
| Hole-transport layer (HTL) | 30 nm NPB (N-naphthyl-N-phenyl-4,4'-diaminobiphenyl) |
| Emission layer (EML) | see Table 1 for materials, concentration and layer thickness |
| Electron conductor (ETL) | 20 nm AlQ₃ (purchased from SynTec, tris(quinolinato)aluminim(III)) |
| Cathode | 1 nm LiF, 150 nm Al on top |

These OLEDs are characterised by standard methods; for this purpose, the electroluminescence spectra, the efficiency (measured in cd/A), the power efficiency (measured in lm/W) as a function of the brightness, calculated from current/voltage/brightness characteristic lines (IUL characteristic lines), and the lifetime are determined. The lifetime is defined as the time after which the initial brightness of 1000 cd/m² has dropped to half.

Table 1 shows the results for some OLEDs (Examples 10 to 17) which comprise dopants D1 and D2 (comparative examples) and D3 to D8 (examples according to the invention), where the composition of the EML including the layer thicknesses is also given in each case. The host material employed in all cases is 9,10-bis(1-naphthyl) anthracene (H1), which is depicted below:

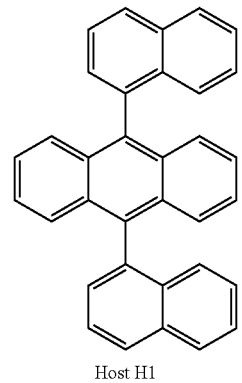

Host H1

For these OLEDs, the degree of doping, i.e. the proportion of the dopant in the host material, is in each case optimised in such a way that the best results with respect to colour and lifetime are obtained. With D1 and D2, the best results are obtained with a degree of doping of 2%, whereas the colour coordinates and the lifetime are impaired at 5%. By contrast, the best results with D3 to D8 are obtained with a degree of doping of 5%.

As can be seen from the examples in Table 1, the tristilbenamine derivatives according to the invention exhibit dark-blue emission with better colour coordinates and improved efficiency at the same time as a significantly improved lifetime compared with the tristilbenamine derivatives in accordance with the prior art.

TABLE 1

| Example | HTL1 | HTL2 | EML | Max. efficiency (cd/A) | Voltage (V) at 100 cd/m² | CIE | Lifetime (h) |
|---|---|---|---|---|---|---|---|
| Example 10 (comparison) | HTL-1 (10 nm) | NPB (30 nm) | H1:D1 (2%) (30 nm) | 3.4 | 5.1 | x = 0.15; y = 0.16 | 500 |
| Example 11 (comparison) | HTL-1 (10 nm) | NPB (30 nm) | H1:D2 (2%) (30 nm) | 3.6 | 5.0 | x = 0.15; y = 0.17 | 800 |
| Example 12 | HTL-1 (10 nm) | NPB (20 nm) | H1:D3 (5%) (30 nm) | 4.2 | 5.1 | x = 0.15; y = 0.11 | 1600 |
| Example 13 | HTL-1 (10 nm) | NPB (30 nm) | H1:D4 (5%) (30 nm) | 4.9 | 4.5 | x = 0.15; y = 0.13 | 1200 |
| Example 14 | HTL-1 (10 nm) | NPB (30 nm) | H1:D5 (5%) (30 nm) | 4.7 | 4.7 | x = 0.15; y = 0.14 | 1100 |
| Example 15 | HTL-1 (10 nm) | NPB (30 nm) | H1:D6 (5%) (30 nm) | 4.5 | 4.9 | x = 0.15; y = 0.13 | 1000 |
| Example 16 | HTL-1 (10 nm) | NPB (20 nm) | H1:D7 (5%) (30 nm) | 4.4 | 5.0 | x = 0.15; y = 0.12 | 1500 |
| Example 17 | HTL-1 (10 nm) | NPB (30 nm) | H1:D8 (5%) (30 nm) | 4.0 | 5.2 | x = 0.16; y = 0.14 | 1050 |

The invention claimed is:

1. An organic electroluminescent device comprising an anode, a cathode, and at least one organic layer capable of emitting light, wherein said at least one organic layer comprises at least one compound of formula (1)

Formula (1)

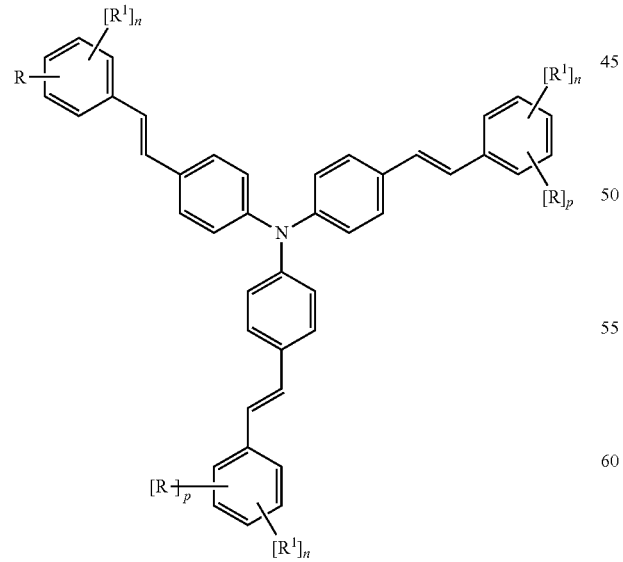

wherein
R is, identically or differently on each occurrence, F; $OCF_3$; $Si(R^2)_3$; $B(OR^2)_2$; a straight-chain, branched, or cyclic alkyl, alkoxy or thioalkoxy group having 4 to 10 C atoms optionally substituted by one or more radicals $R^1$, wherein one or more non-adjacent $CH_2$ groups are optionally replaced by $-R^2C=CR^2-$, $-C\equiv C-$, $Si(R^2)_2$, $Ge(R^2)_2$, $Sn(R^2)_2$, $C=O$, $C=S$, $C=Se$, $C=NR^2$, $-O-$, $-S-$, or $-CONR^2-$, and wherein one or more H atoms are optionally replaced by F, Cl, Br, I, CN or $NO_2$; wherein when R is an alkyl, alkoxy, or thioalkoxy group, R optionally has two bonds to the phenyl group to define a cyclic, condensed ring system;

$R^1$ is, identically or differently on each occurrence, F; Cl; Br; I; CN; $Si(R^2)_3$; $B(OR^2)_2$; a straight-chain alkyl, alkoxy or thioalkoxy group having up to 40 C atoms optionally substituted by one or more radicals $R^2$, wherein one or more non-adjacent $CH_2$ groups are optionally replaced by $-R^2C=CR^2-$, $-C\equiv C-$, $Si(R^2)_2$, $Ge(R^2)_2$, $Sn(R^2)_2$, $C=O$, $C=S$, $C=Se$, $C=NR^2$, $-O-$, $-S-$, or $-CONR^2-$ and wherein one or more H atoms are optionally replaced by F, Cl, Br, I, CN, or $NO_2$; a branched or cyclic alkyl, alkoxy or thioalkoxy group having 3 to 40 C atoms optionally substituted by one or more radicals $R^2$, wherein one or more non-adjacent $CH_2$ groups are optionally replaced by $-R^2C=CR^2-$, $-C\equiv C-$, $Si(R^2)_2$, $Ge(R^2)_2$, $Sn(R^2)_2$, $C=O$, $C=S$, $C=Se$, $C=NR^2$, $-O-$, $-S-$, or $-CONR^2-$ and wherein one or more H atoms are optionally replaced by F, Cl, Br, I, CN, or $NO_2$; an aromatic or heteroaromatic ring system having 5 to 30 aromatic ring atoms optionally substituted by one or more radicals $R^2$; or an aryloxy or heteroaryloxy group having 5 to 24 aromatic ring atoms optionally substituted by one or more radicals $R^2$; or a combination of two, three, four, or five of these systems; and wherein two or more substituents $R^1$ optionally define a mono- or polycyclic, aliphatic or aromatic ring system with one another;

$R^2$ is, identically or differently on each occurrence, H or a hydrocarbon radical having up to 20 C atoms, wherein said radical is aliphatic, aromatic, or a combination of aliphatic and aromatic and wherein individual H atoms are optionally replaced by fluorine; and wherein two or more radicals $R^2$ optionally define a mono- or polycyclic, aliphatic or aromatic ring system with one another;

n is, identically or differently on each occurrence, 0, 1, 2, 3, or 4;

p is, identically or differently on each occurrence, 0 or 1; and wherein the compound of formula (1) or formula (1a) is mixed with a host material and incorporated in an emitting layer.

2. The organic electroluminescent device of claim 1, wherein said organic layer comprises at least one compound of the formula (1a)

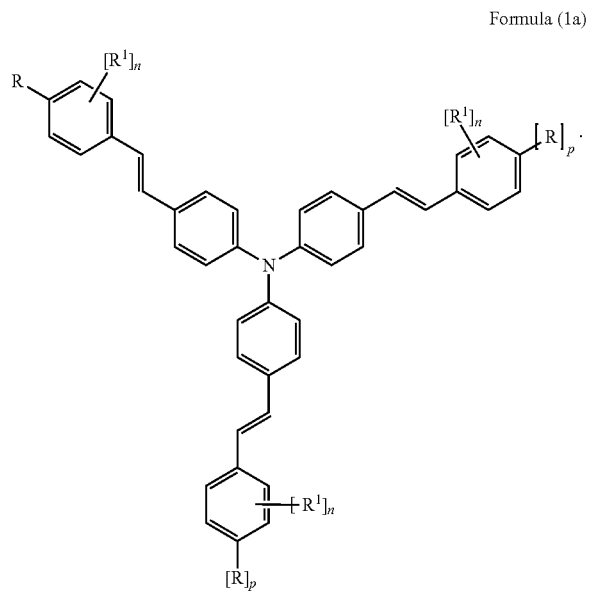

Formula (1a)

3. The organic electroluminescent device of claim 1, wherein R does not contain any benzylic protons or R represents a bi- or polycyclic alkyl group bonded to the phenyl group via a bridgehead atom.

4. The organic electroluminescent device of claim 1, wherein $R^1$ is, identically or differently on each occurrence, F; $Si(R^2)_3$; $B(OR^2)_2$; a straight-chain alkyl or alkoxy group having up to 6 C atoms, wherein one or more $CH_2$ groups are optionally replaced by $-R^2C=CR^2-$, $Si(R^2)_2$, $-O-$, or $-S$ and wherein one or more H atoms are optionally replaced by F; a branched or cyclic alkyl or alkoxy group having 3 to 10 C atoms, wherein one or more $CH_2$ groups are optionally replaced by $-R^2C=CR^2-$, $Si(R^2)_2$, $-O-$, or $-S$ and wherein one or more H atoms are optionally replaced by F; or an aryl or heteroaryl group having 5 to 14 aromatic ring atoms; or a combination of two or three of these systems; and wherein two or more adjacent radicals $R^1$ optionally define a mono- or polycyclic, aliphatic ring system with one another.

5. The organic electroluminescent device of claim 1, wherein n is, identically or differently on each occurrence, 0 or 1.

6. The organic electroluminescent device of claim 1, wherein the compound of formula (1) or formula (1a) has a threefold axis of rotation.

7. The organic electroluminescent device of claim 1, wherein said host material is selected from the group consisting of oligoarylenes, oligoarylenevinylenes, polypodal metal complexes, hole-conducting compounds, electron-conducting compounds, phosphine oxides or sulfoxides, atropisomers, and boronic acid derivatives.

8. The organic electroluminescent device of claim 7, wherein said oligoarylenes are oligoarylenes containing condensed aromatic groups and said electron-conducting compounds are ketones.

9. The organic electroluminescent device of claim 1, wherein the proportion of the compound of formula (1) in the mixture is between 0.5 and 50.0% by weight and the proportion of said host material in the mixture is between 50.0 and 99.5% by weight.

10. The organic electroluminescent device of claim 1, further comprising a plurality of emitting layers, at least one of which comprises at least one compound of formula (1).

11. The organic electroluminescent device of claim 1, further comprising at least one additional layer selected from the group consisting of hole-injection layers, hole-transport layers, electron-transport layers, electron-injection layers, and combinations thereof, wherein said at least one additional layer is optionally doped.

12. A compound of formula (1)

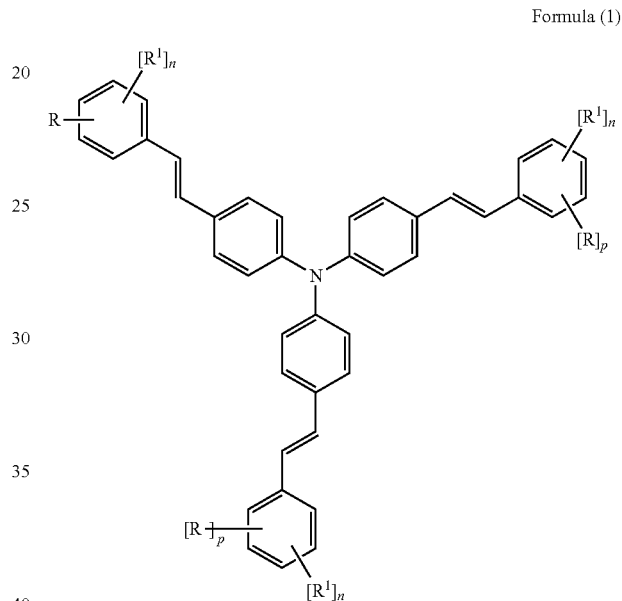

Formula (1)

wherein

R is, identically or differently on each occurrence, F; $OCF_3$; $Si(R^2)_3$; $B(OR^2)_2$; a straight-chain, branched, or cyclic alkoxy or thioalkoxy group having 4 to 10 C atoms optionally substituted by one or more radicals $R^1$, wherein one or more non-adjacent $CH_2$ groups are optionally replaced by $-R^2C=CR^2-$, $-C\equiv C-$, $Si(R^2)_2$, $Ge(R^2)_2$, $Sn(R^2)_2$, $C=O$, $C=S$, $C=Se$, $C=NR^2$, $-O-$, $-S$, or $-CONR^2-$, and wherein one or more H atoms are optionally replaced by F, Cl, Br, I, CN or $NO_2$; wherein when R is an alkoxy or thioalkoxy group, R optionally has two bonds to the phenyl group to define a cyclic, condensed ring system; and wherein R is optionally an alkyl group having 4 to 10 C atoms which has two bonds to the phenyl group to define a cyclic, condensed ring system;

$R^1$ is, identically or differently on each occurrence, F; Cl; Br; I; CN; $Si(R^2)_3$; $B(OR^2)_2$; a straight-chain alkyl, alkoxy or thioalkoxy group having up to 40 C atoms optionally substituted by one or more radicals $R^2$, wherein one or more non-adjacent $CH_2$ groups are optionally replaced by $-R^2C=CR^2-$, $-C\equiv C-$, $Si(R^2)_2$, $Ge(R^2)_2$, $Sn(R^2)_2$, $C=O$, $C=S$, $C=Se$, $C=NR^2$, $-O-$, $-S$ or $-CONR^2-$ and wherein one or more H atoms are optionally replaced by F, Cl, Br, I, CN, or $NO_2$; a branched or cyclic alkyl, alkoxy or thioalkoxy group having 3 to 40 C atoms optionally substituted by one or more radicals $R^2$, wherein one or more non-adjacent $CH_2$ groups are optionally replaced by —$R^2C$=$CR^2$—, —C≡C—, $Si(R^2)_2$, $Ge(R^2)_2$, $Sn(R^2)_2$, C=O, C=S, C=Se, C=$NR^2$, —O—, —S, or —$CONR^2$— and wherein one or more H atoms are optionally replaced by F, Cl, Br, I, CN, or $NO_2$; an aromatic or heteroaromatic ring system having 5 to 30 aromatic ring atoms optionally substituted by one or more radicals $R^2$; or an aryloxy or heteroaryloxy group having 5 to 24 aromatic ring atoms optionally substituted by one or more radicals $R^2$; or a combination of two, three, four, or five of these systems; and wherein two or more substituents $R^1$ optionally define a mono- or polycyclic, aliphatic or aromatic ring system with one another;

$R^2$ is, identically or differently on each occurrence, H or a hydrocarbon radical having up to 20 C atoms, wherein said radical is aliphatic, aromatic, or a combination of aliphatic and aromatic and wherein individual H atoms are optionally replaced by fluorine; and wherein two or more radicals $R^2$ optionally define a mono- or polycyclic, aliphatic or aromatic ring system with one another;

n is, identically or differently on each occurrence, 0, 1, 2, 3, or 4;

p is 1; and with the proviso that the following compound is excluded:

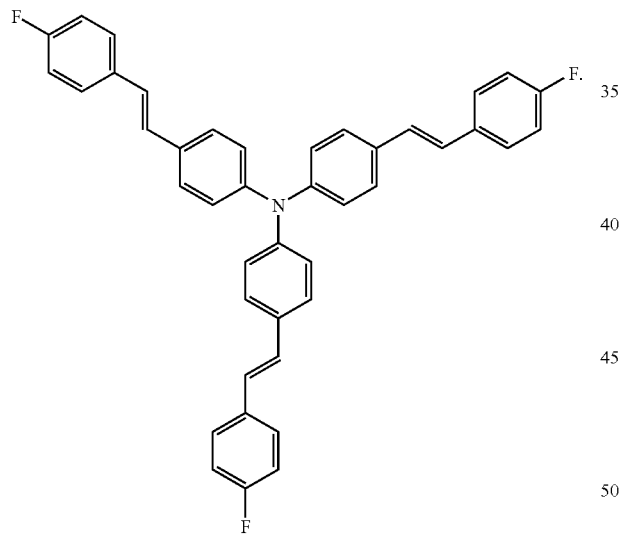

13. A mixture comprising the compound of claim 12 and at least one host material.

14. A process for preparing the compound of claim 12, comprising reacting tris(4-bromophenyl)amine with an appropriately substituted styrene derivative in a Heck coupling or reacting tris(4-formylphenyl)amine with an appropriately substituted dialkyl benzyl phosphonate.

15. An organic electroluminescent device comprising an anode, a cathode, and at least one organic layer capable of emitting light, wherein said at least one organic layer comprises at least one compound of formula (1)

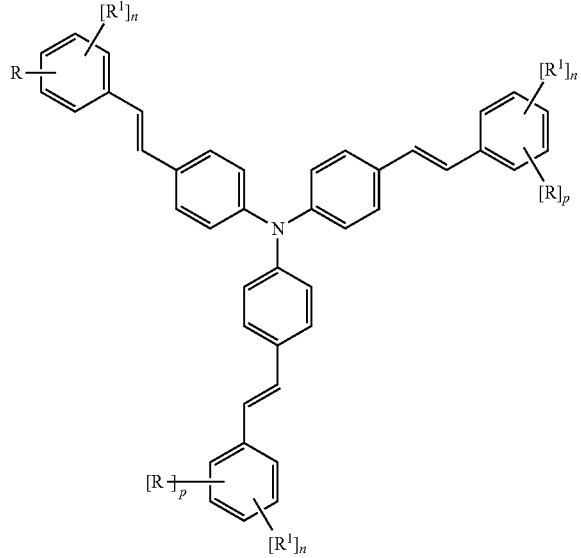

Formula (1)

wherein

R is, identically or differently on each occurrence, F, $Si(R^2)_3$, $B(OR^2)_2$, or a straight-chain, branched or cyclic alkyl group having 4 to 10 C atoms, wherein one or more H atoms are optionally replaced by F;

$R^1$ is, identically or differently on each occurrence, F; Cl; Br; I; CN; $Si(R^2)_3$; $B(OR^2)_2$; a straight-chain alkyl, alkoxy or thioalkoxy group having up to 40 C atoms optionally substituted by one or more radicals $R^2$, wherein one or more non-adjacent $CH_2$ groups are optionally replaced by —$R^2C$=$CR^2$—, —C≡C—, $Si(R^2)_2$, $Ge(R^2)_2$, $Sn(R^2)_2$, C=O, C=S, C=Se, C=$NR^2$, —O—, —S, or —$CONR^2$— and wherein one or more H atoms are optionally replaced by F, Cl, Br, I, CN, or $NO_2$; a branched or cyclic alkyl, alkoxy or thioalkoxy group having 3 to 40 C atoms optionally substituted by one or more radicals $R^2$, wherein one or more non-adjacent $CH_2$ groups are optionally replaced by —$R^2C$=$CR^2$—, —C≡C—, $Si(R^2)_2$, $Ge(R^2)_2$, $Sn(R^2)_2$, C=O, C=S, C=Se, C=$NR^2$, —O—, —S, or —$CONR^2$— and wherein one or more H atoms are optionally replaced by F, Cl, Br, I, CN, or $NO_2$; an aromatic or heteroaromatic ring system having 5 to 30 aromatic ring atoms optionally substituted by one or more radicals $R^2$; or an aryloxy or heteroaryloxy group having 5 to 24 aromatic ring atoms optionally substituted by one or more radicals $R^2$; or a combination of two, three, four, or five of these systems; and wherein two or more substituents $R^1$ optionally define a mono- or polycyclic, aliphatic or aromatic ring system with one another;

$R^2$ is, identically or differently on each occurrence, H or a hydrocarbon radical having up to 20 C atoms, wherein said radical is aliphatic, aromatic, or a combination of aliphatic and aromatic and wherein individual H atoms are optionally replaced by fluorine; and wherein two or more radicals $R^2$ optionally define a mono- or polycyclic, aliphatic or aromatic ring system with one another;

n is, identically or differently on each occurrence, 0, 1, 2, 3, or 4;

p is, identically or differently on each occurrence, 0 or 1; and wherein the compound of formula (1) or formula (1a) is mixed with a host material and incorporated in an emitting layer.

16. The organic electroluminescent device of claim 15, wherein R does not contain any benzylic protons or R represents a bi- or polycyclic alkyl group bonded to the phenyl group via a bridgehead atom.

17. An organic electroluminescent device comprising an anode, a cathode, and at least one organic layer capable of emitting light, wherein said at least one organic layer comprises at least one compound of formula (1)

Formula (1)

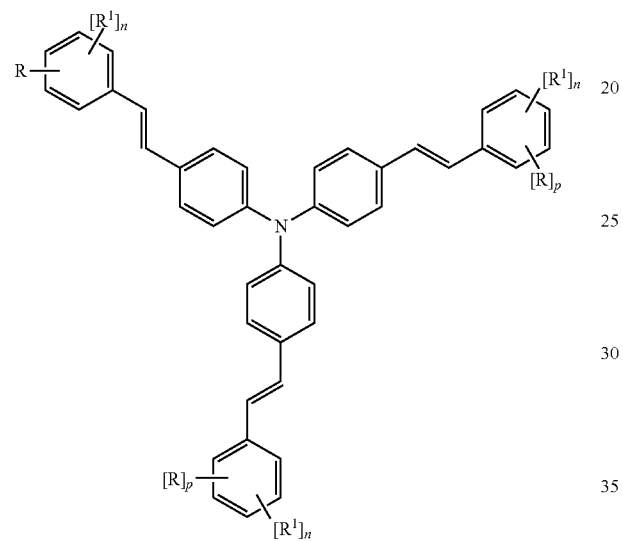

wherein

R is, identically or differently on each occurrence, $Si(R^2)_3$, $B(OR^2)_2$, a branched alkyl group having 4, 5, or 6 C atoms or a cyclic alkyl group having 5 to 10 C atoms, wherein one or more H atoms are optionally replaced by F;

$R^1$ is, identically or differently on each occurrence, F; Cl; Br; I; CN; $Si(R^2)_3$; $B(OR^2)_2$; a straight-chain alkyl, alkoxy or thioalkoxy group having up to 40 C atoms optionally substituted by one or more radicals $R^2$, wherein one or more non-adjacent $CH_2$ groups are optionally replaced by $-R^2C=CR^2-$, $-C\equiv C-$, $Si(R^2)_2$, $Ge(R^2)_2$, $Sn(R^2)_2$, $C=O$, $C=S$, $C=Se$, $C=NR^2$, $-O-$, $-S-$, or $-CONR^2-$ and wherein one or more H atoms are optionally replaced by F, Cl, Br, I, CN, or $NO_2$; a branched or cyclic alkyl, alkoxy or thioalkoxy group having 3 to 40 C atoms optionally substituted by one or more radicals $R^2$, wherein one or more non-adjacent $CH_2$ groups are optionally replaced by $-R^2C=CR^2-$, $-C\equiv C-$, $Si(R^2)_2$, $Ge(R^2)_2$, $Sn(R^2)_2$, $C=O$, $C=S$, $C=Se$, $C=NR^2$, $-O-$, $-S-$, or $-CONR^2-$ and wherein one or more H atoms are optionally replaced by F, Cl, Br, I, CN, or $NO_2$; an aromatic or heteroaromatic ring system having 5 to 30 aromatic ring atoms optionally substituted by one or more radicals $R^2$; or an aryloxy or heteroaryloxy group having 5 to 24 aromatic ring atoms optionally substituted by one or more radicals $R^2$; or a combination of two, three, four, or five of these systems; and wherein two or more substituents $R^1$ optionally define a mono- or polycyclic, aliphatic or aromatic ring system with one another;

$R^2$ is, identically or differently on each occurrence, H or a hydrocarbon radical having up to 20 C atoms, wherein said radical is aliphatic, aromatic, or a combination of aliphatic and aromatic and wherein individual H atoms are optionally replaced by fluorine; and wherein two or more radicals $R^2$ optionally define a mono- or polycyclic, aliphatic or aromatic ring system with one another;

n is, identically or differently on each occurrence, 0, 1, 2, 3, or 4;

p is, identically or differently on each occurrence, 0 or 1; and wherein the compound of formula (1) or formula (1a) is mixed with a host material and incorporated in an emitting layer.

* * * * *